(12) United States Patent
Usujima et al.

(10) Patent No.: US 7,906,819 B2
(45) Date of Patent: Mar. 15, 2011

(54) SEMICONDUCTOR DEVICE AND METHOD FOR PRODUCING THE SAME

(75) Inventors: Akihiro Usujima, Kawasaki (JP); Hideyuki Kojima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 184 days.

(21) Appl. No.: 12/350,227

(22) Filed: Jan. 8, 2009

(65) Prior Publication Data
US 2009/0174009 A1 Jul. 9, 2009

(30) Foreign Application Priority Data

Jan. 8, 2008 (JP) ................................ 2008-001220

(51) Int. Cl.
*H01L 27/088* (2006.01)
(52) U.S. Cl. ......................................... 257/392; 257/345
(58) Field of Classification Search .................. 257/392, 257/391, 345; 438/276
See application file for complete search history.

(56) References Cited

U.S. PATENT DOCUMENTS

| | | | |
|---|---|---|---|
| 5,745,372 A | 4/1998 | Fluegge | |
| 6,260,172 B1 | 7/2001 | Hazama | |
| 6,853,581 B2 | 2/2005 | Hazama | |
| 6,857,099 B1 | 2/2005 | Hazama | |
| 6,895,543 B2 | 5/2005 | Hazama | |
| 6,946,903 B2 | 9/2005 | Marshall et al. | |
| 7,139,895 B2 | 11/2006 | Hazama | |
| 7,149,940 B2 | 12/2006 | Hazama | |
| 7,159,158 B2 | 1/2007 | Hazama | |
| 7,233,197 B2 | 6/2007 | Marshall et al. | |
| 7,315,201 B2 | 1/2008 | Marshall et al. | |
| 2009/0174009 A1* | 7/2009 | Usujima et al. | ............... 257/392 |

FOREIGN PATENT DOCUMENTS

| | | |
|---|---|---|
| JP | 5-174162 A | 7/1993 |
| JP | 6-232259 A | 8/1994 |
| JP | 08-503111 T | 4/1996 |
| JP | 8-162945 A | 6/1996 |
| JP | 8-335637 A | 12/1996 |
| JP | 10-143441 A | 5/1998 |
| JP | 2005-005611 A | 1/2005 |
| JP | 2005-503668 T | 2/2005 |
| JP | 2005-101540 A | 4/2005 |
| WO | IB-WO94/10754 | 5/1994 |
| WO | IB-WO03/025804 | 3/2003 |

* cited by examiner

*Primary Examiner* — Mark Prenty
(74) *Attorney, Agent, or Firm* — Fujitsu Patent Center

(57) ABSTRACT

The semiconductor device includes the concentration of the impurity of the first conductivity type in a doped channel layer of a first conductivity type in the pass transistor is set at a relatively low value, and pocket regions of the first conductivity type in a pass transistor are formed so as to be relatively shallow with a relatively high impurity concentration.

8 Claims, 15 Drawing Sheets

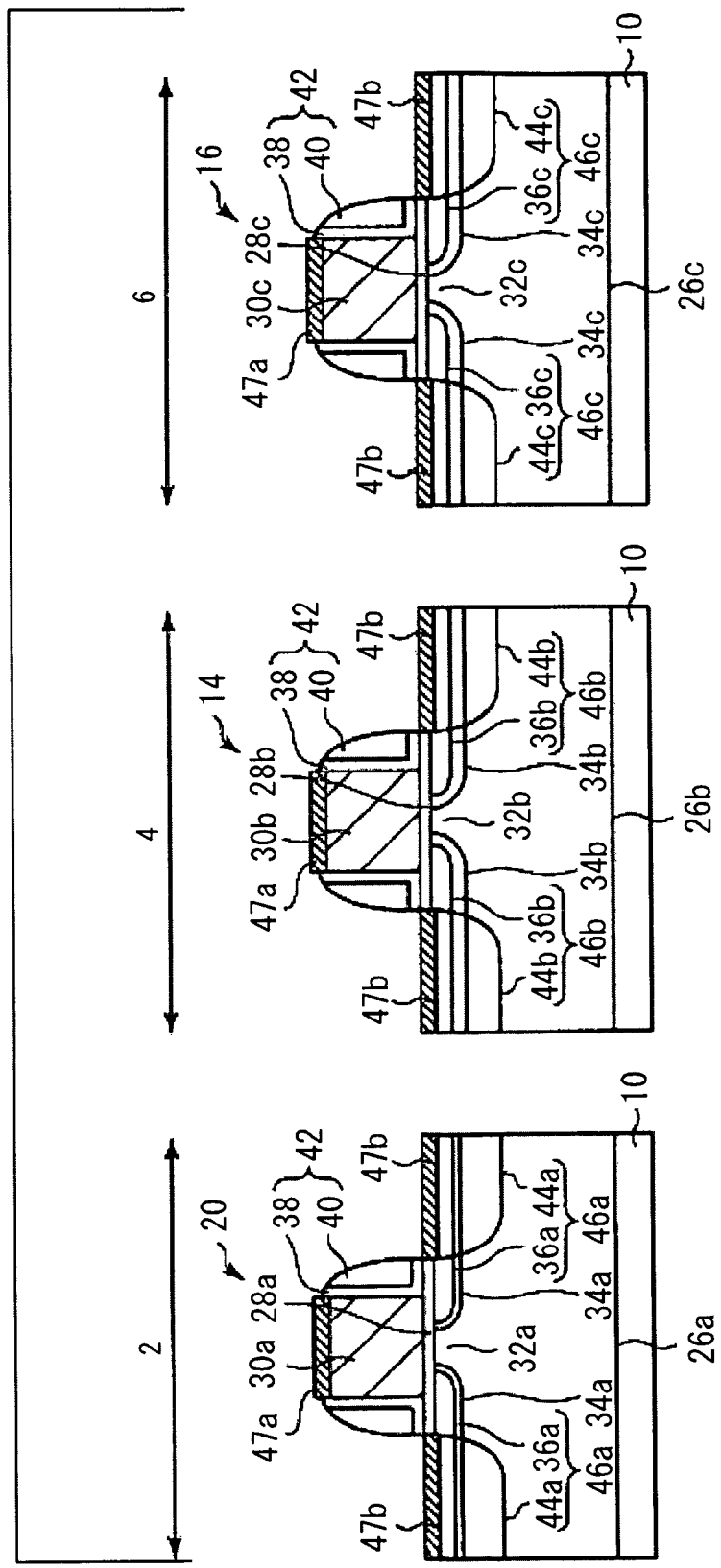

FIG. 3
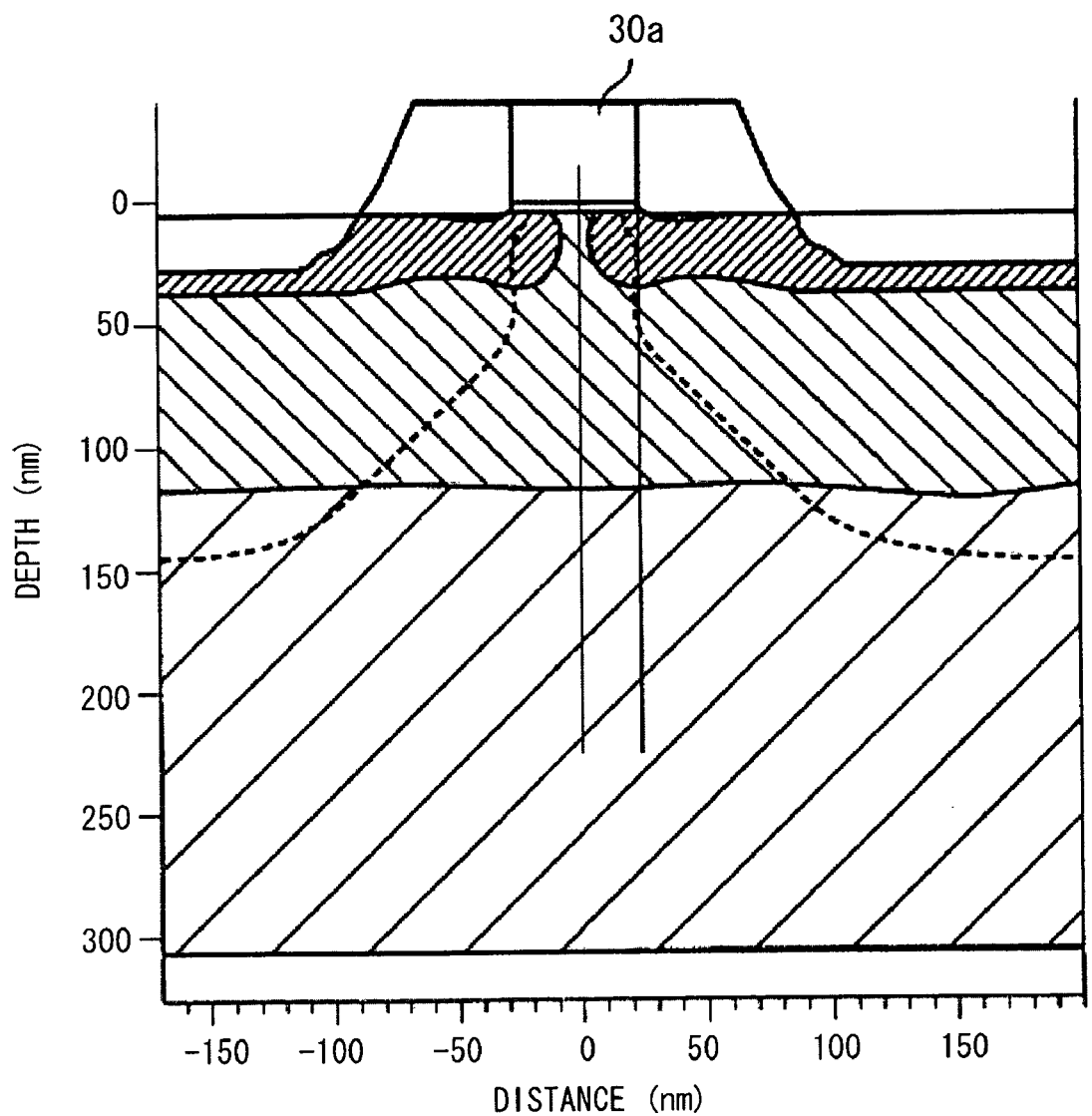
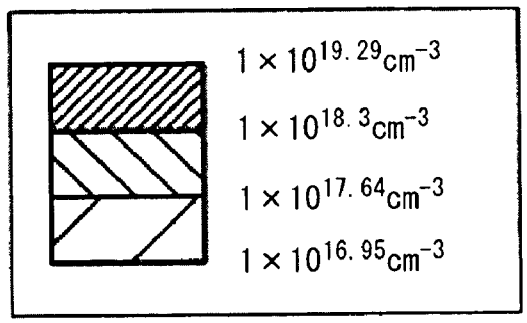

FIG. 5
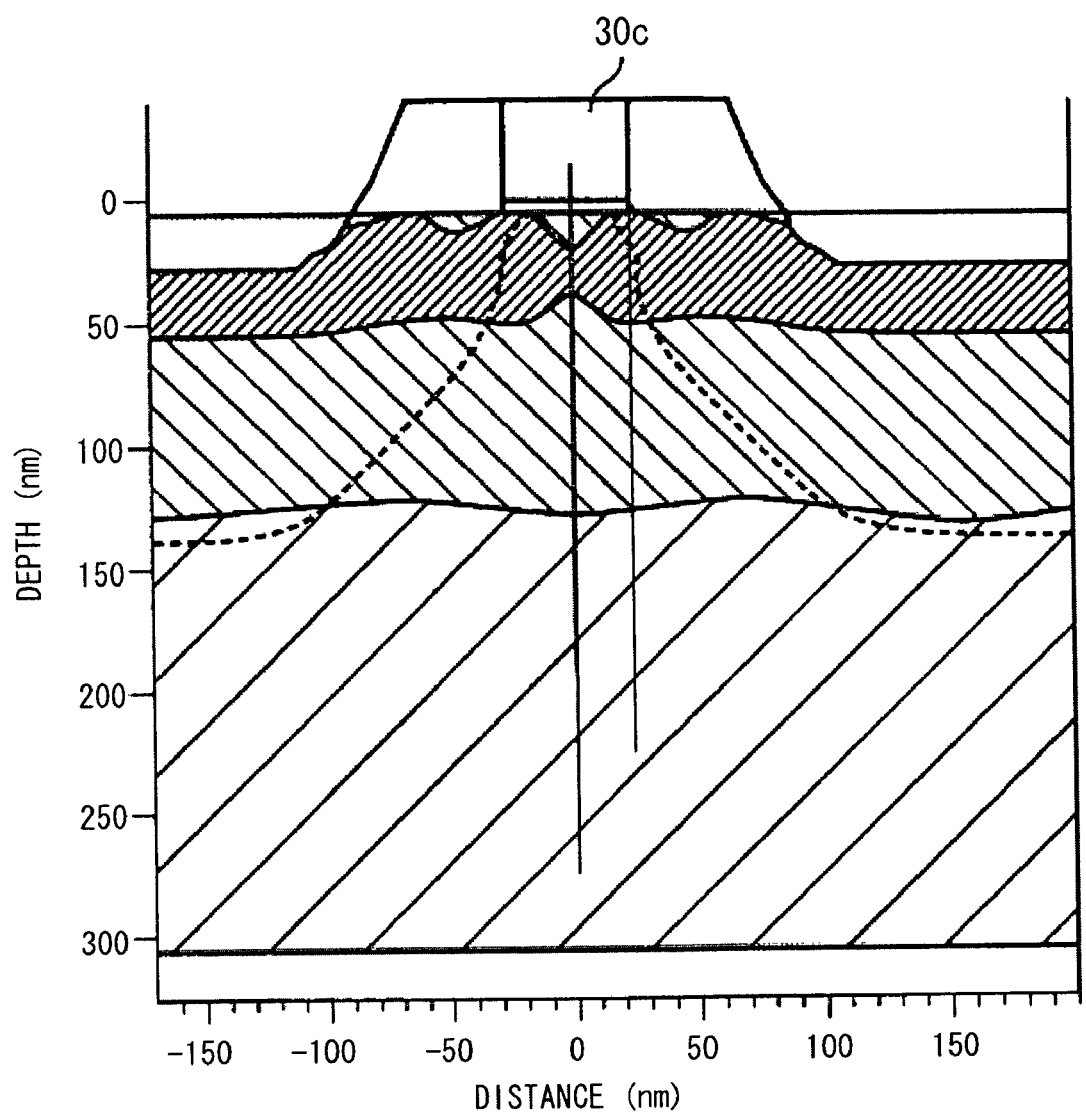
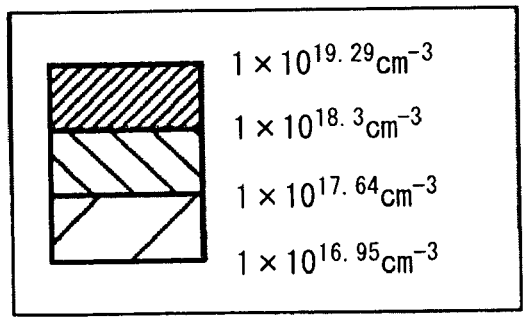

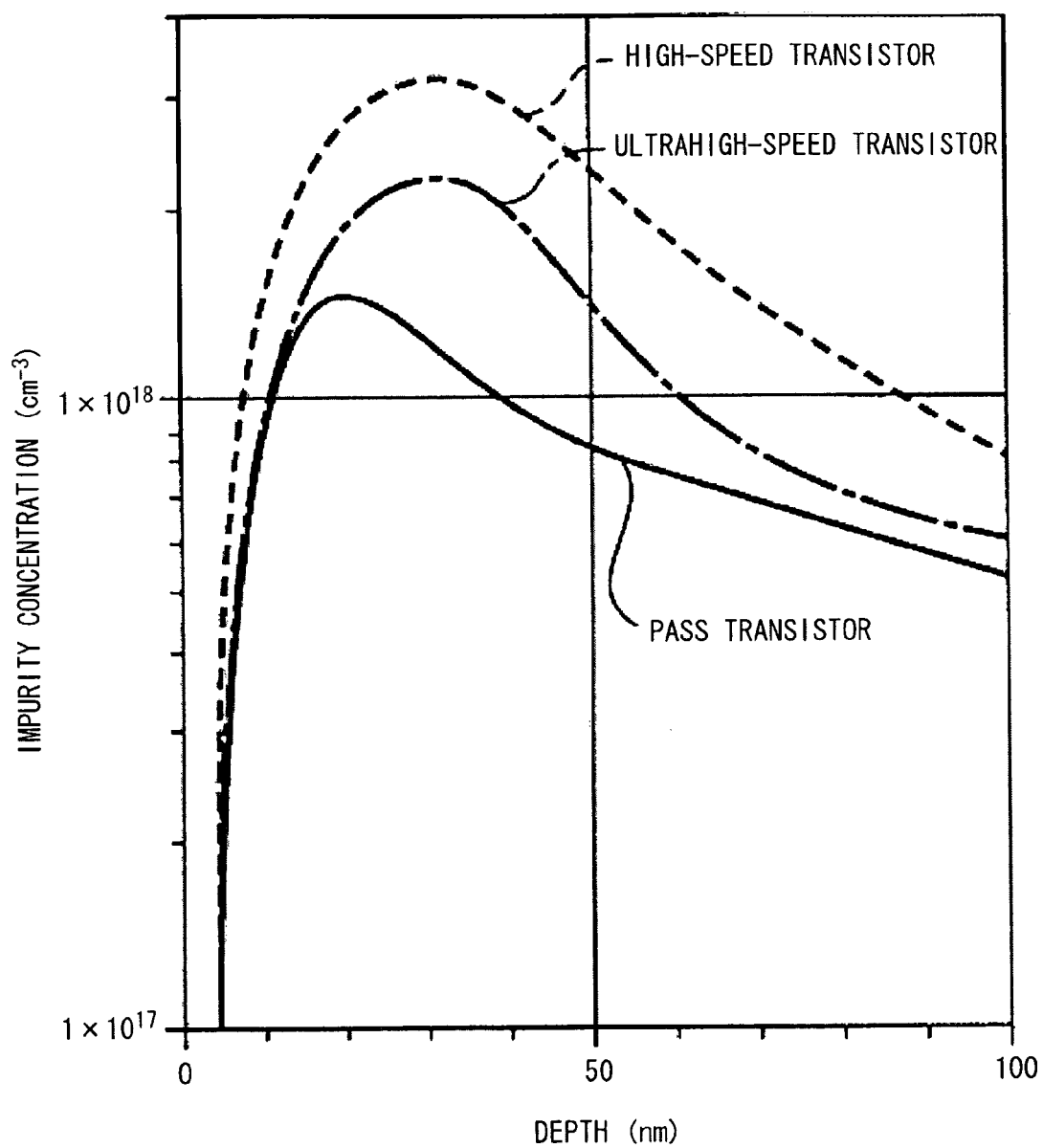

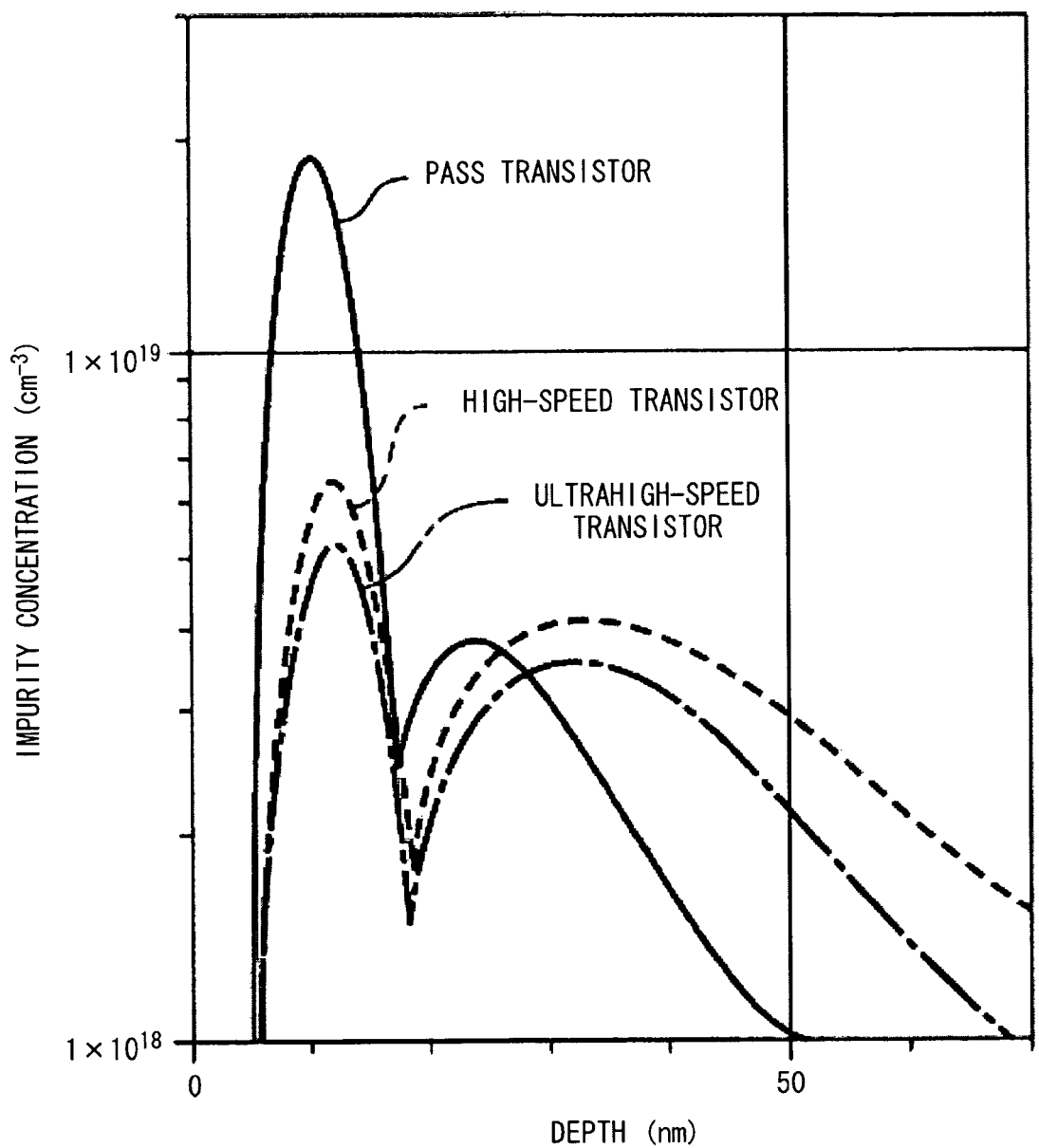

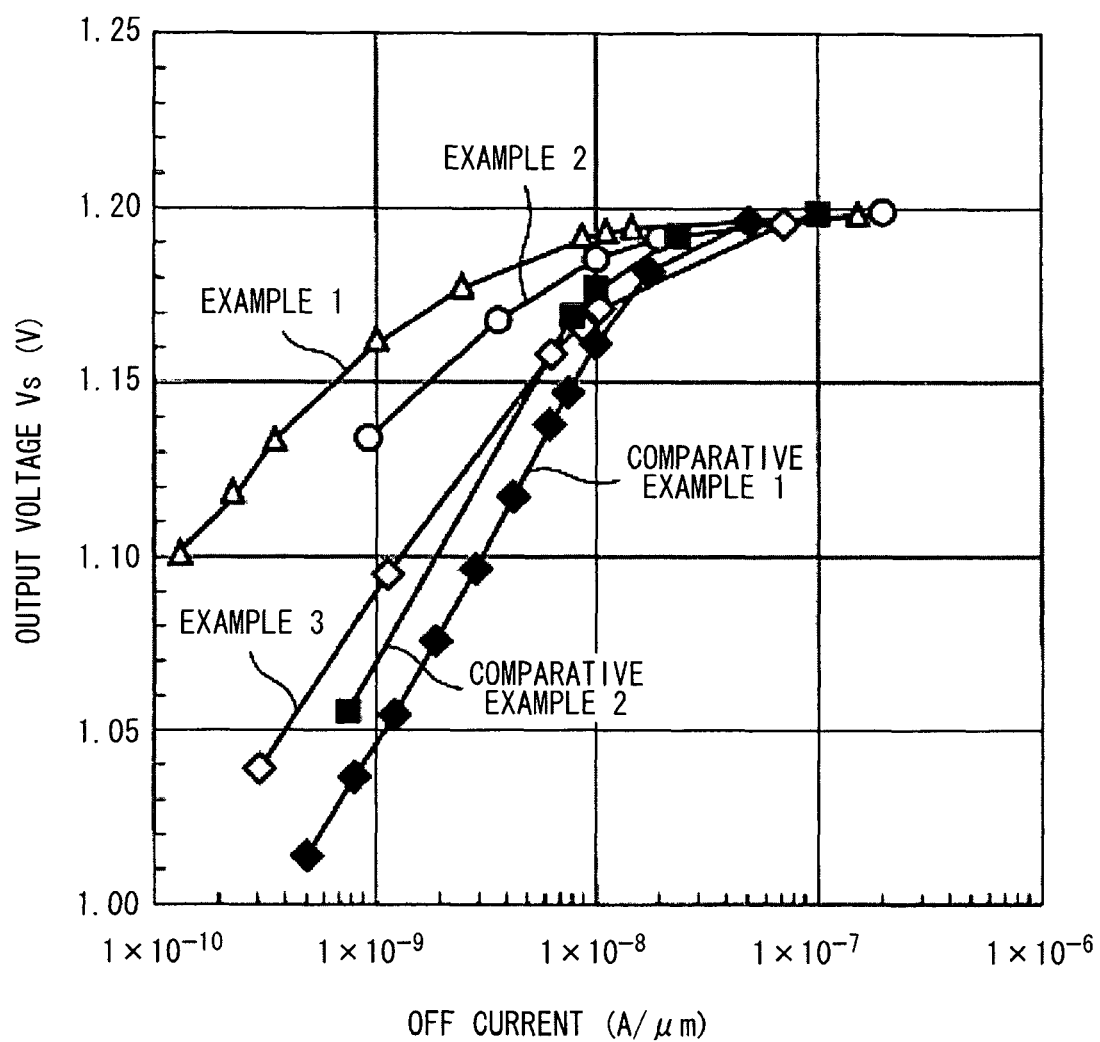

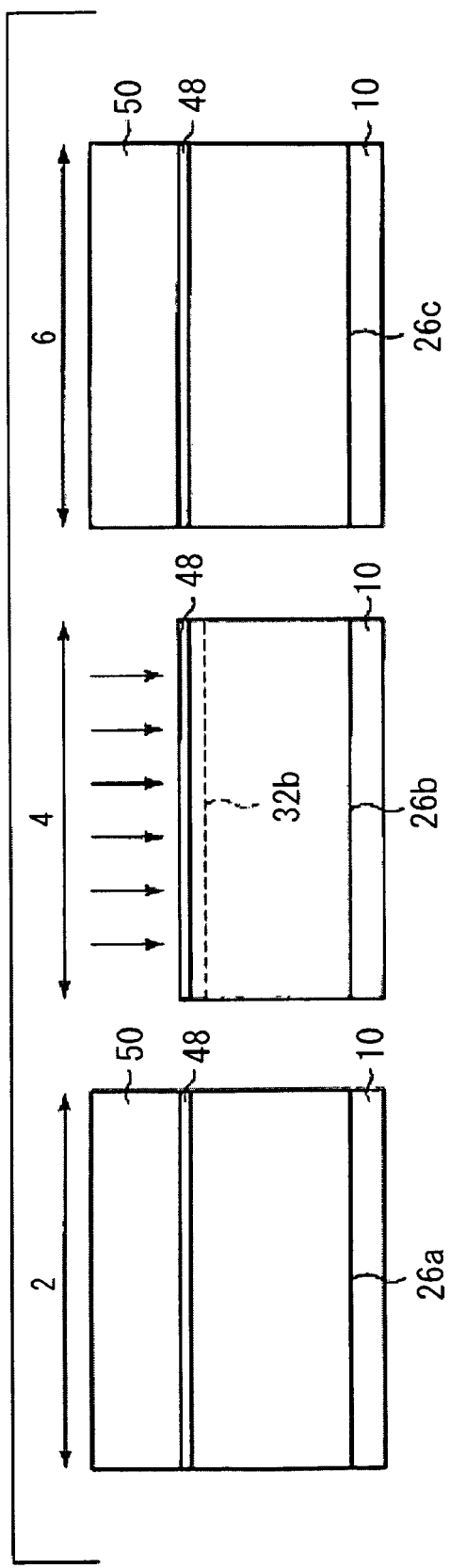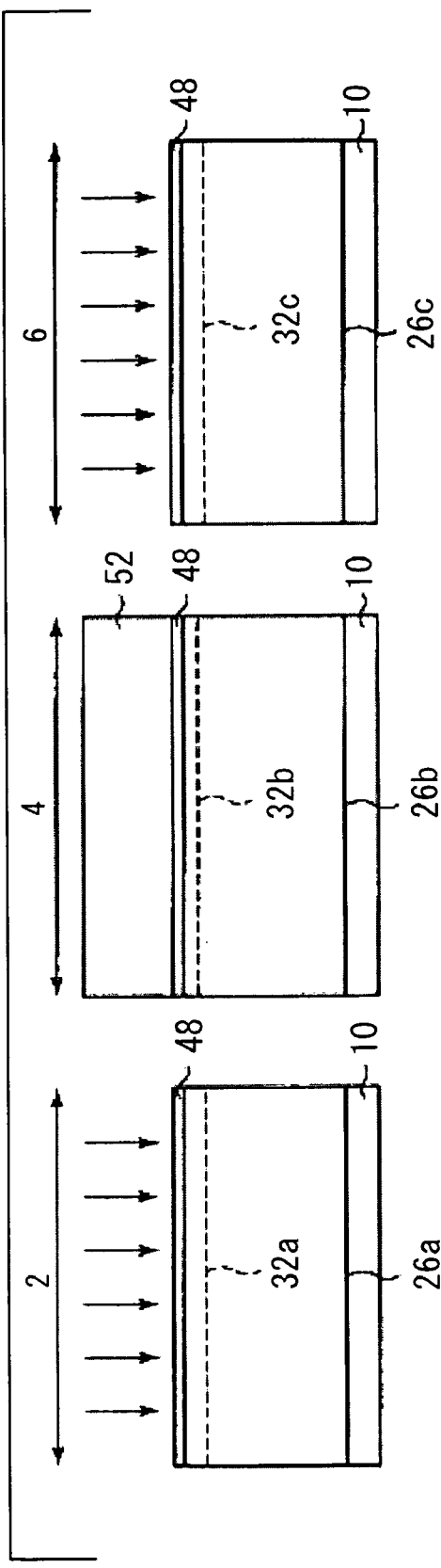

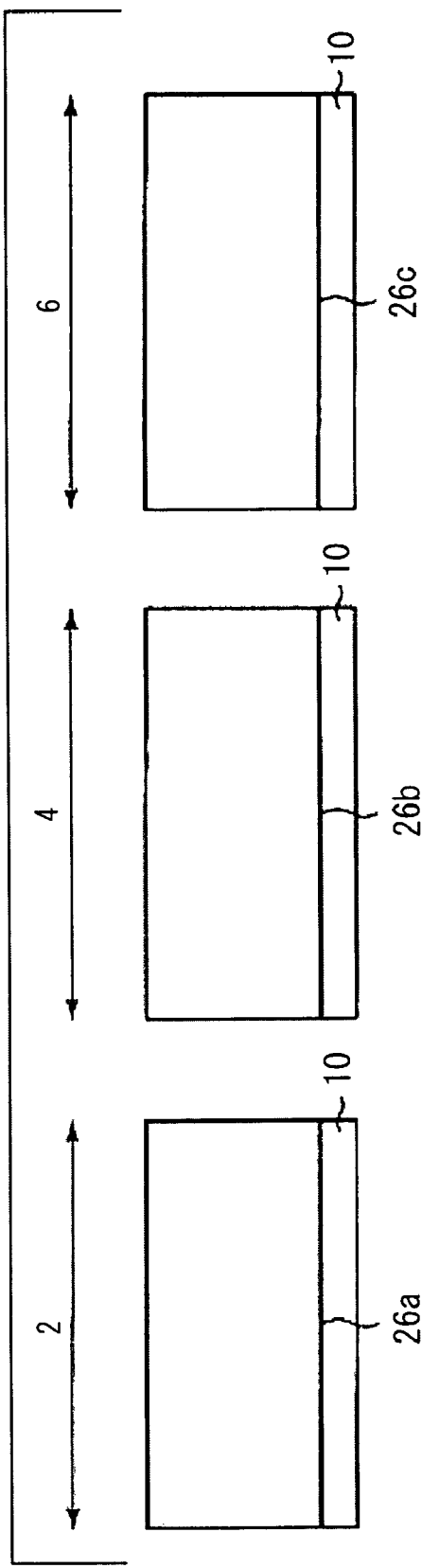
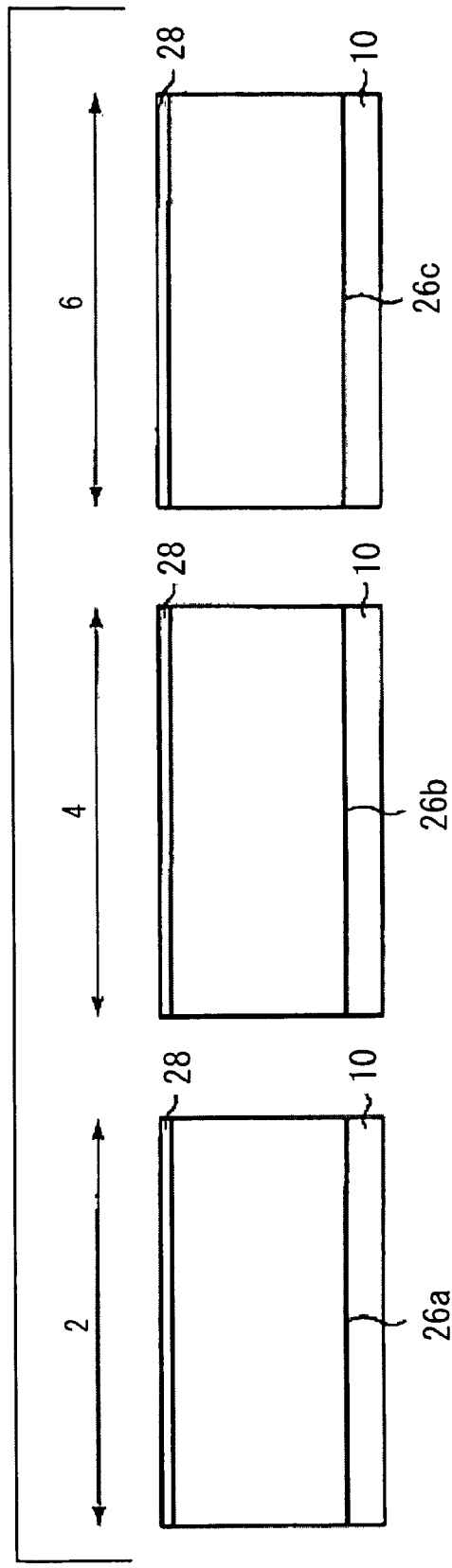

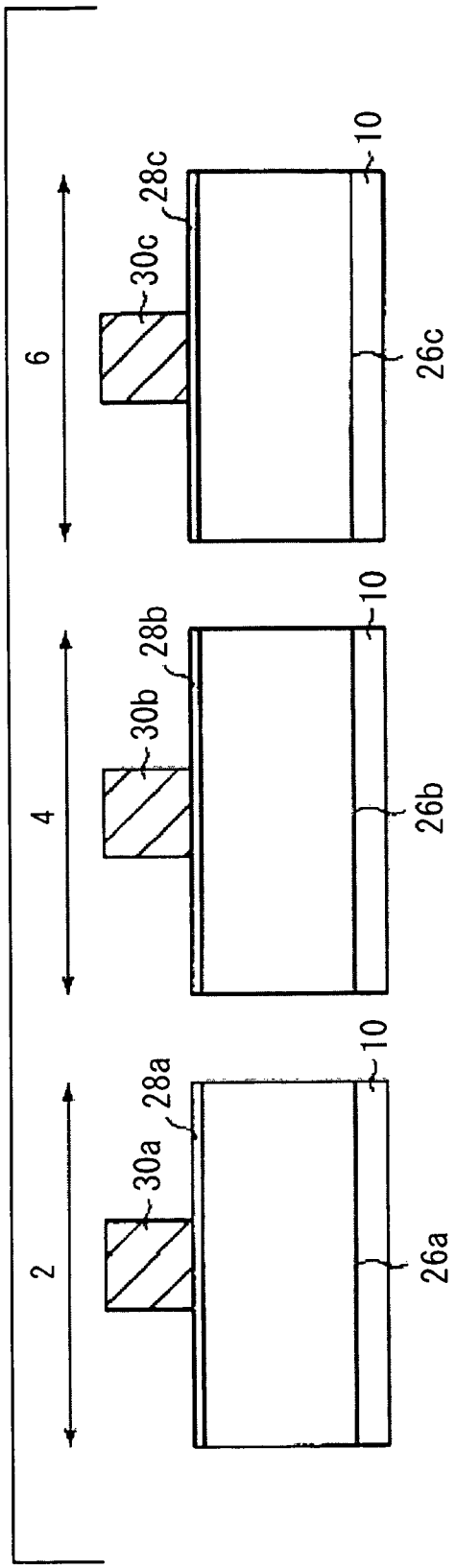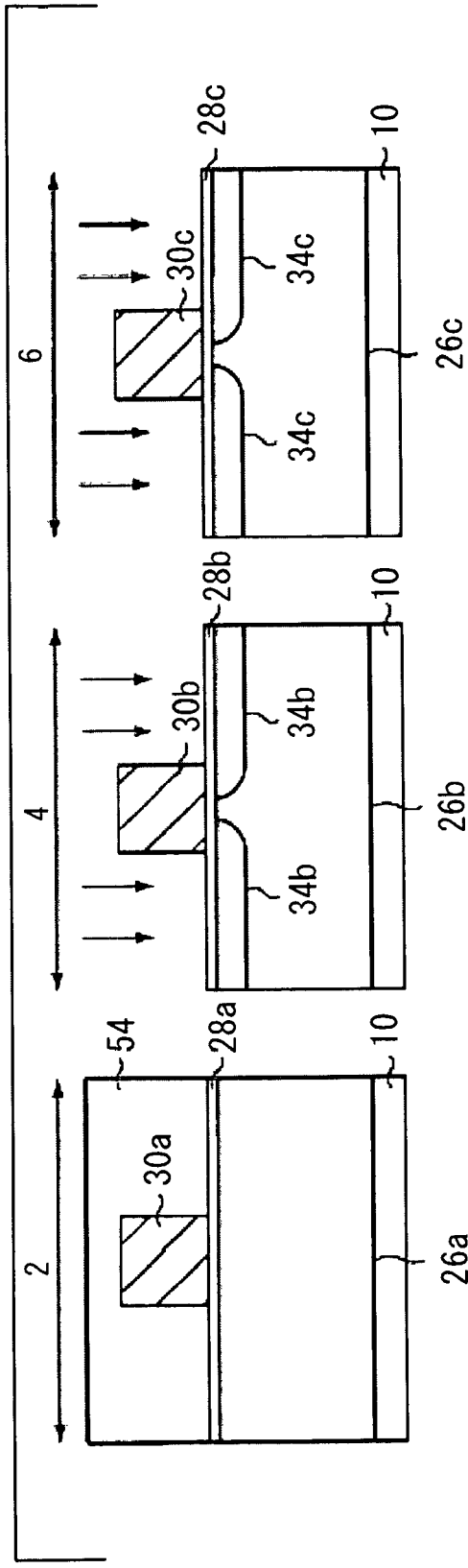

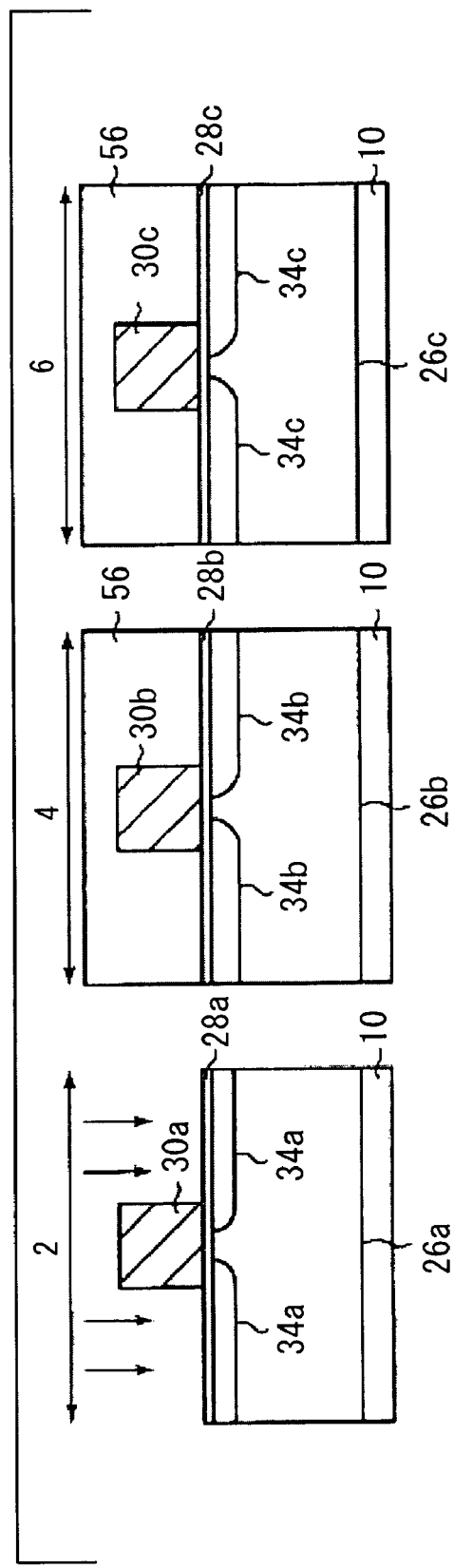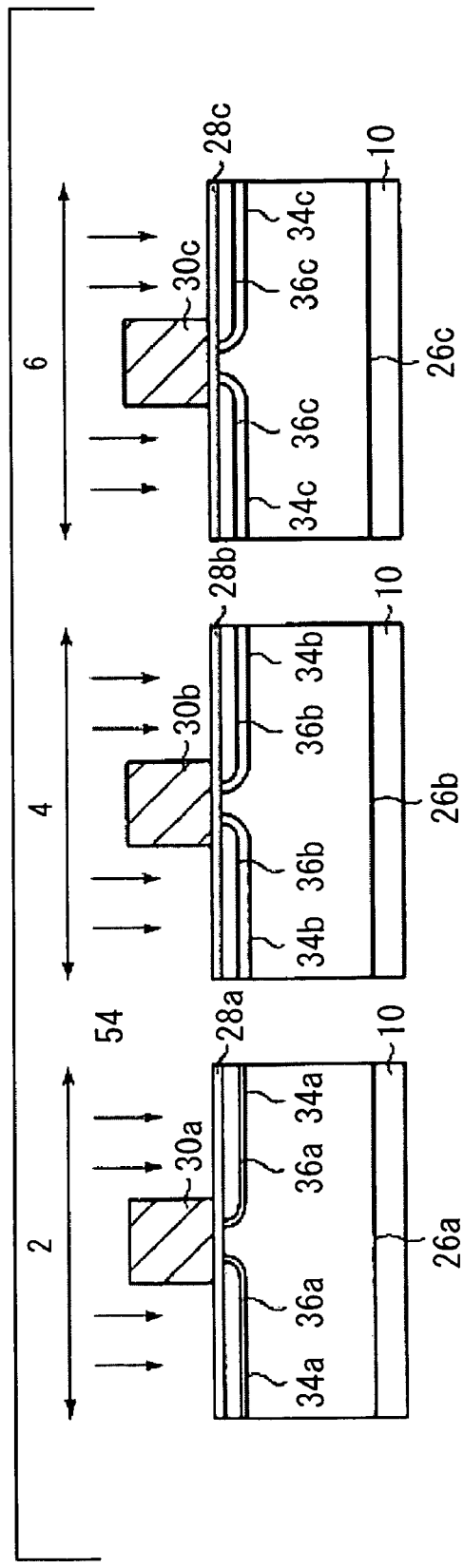

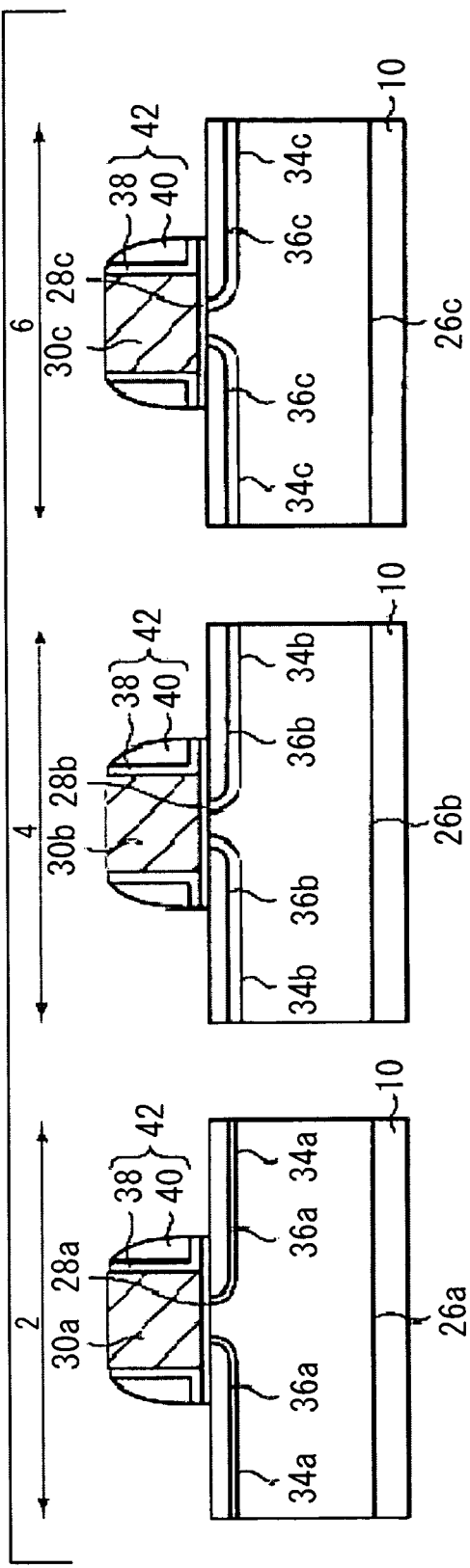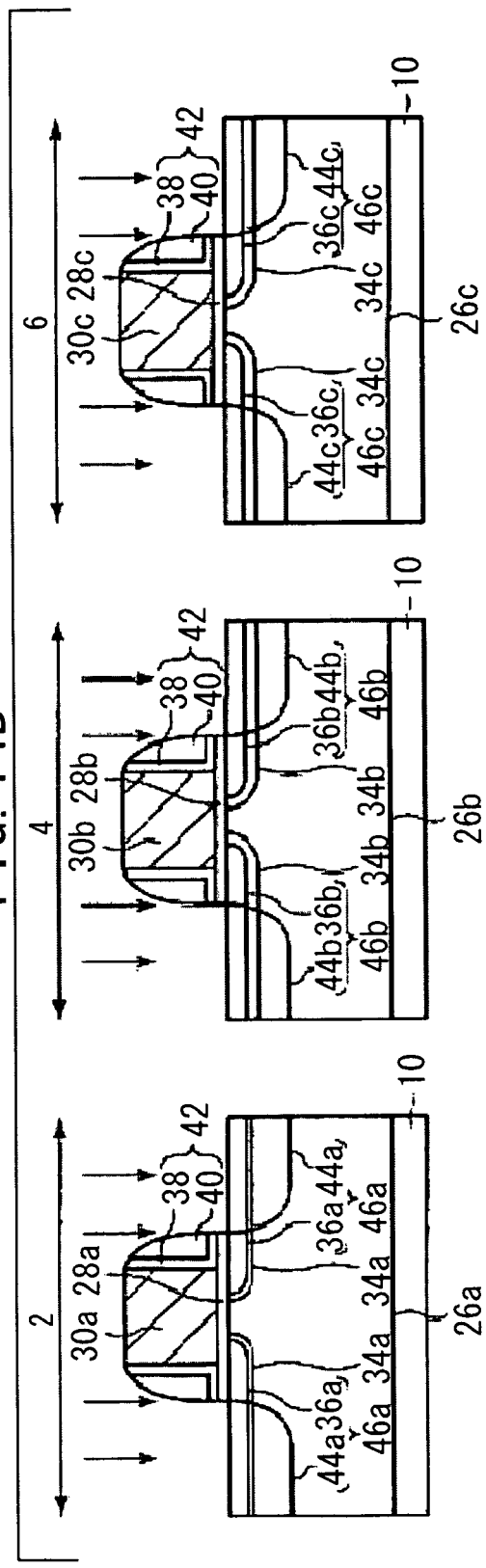

US 7,906,819 B2

SEMICONDUCTOR DEVICE AND METHOD FOR PRODUCING THE SAME

CROSS-REFERENCE TO RELATED APPLICATION

This application is based upon and claims the benefit of priority from the prior Japanese Patent Application No. 2008-1220 filed on Jan. 8, 2008, the entire contents of which are incorporated herein by reference.

BACKGROUND

1. Field

The present invention relates to a semiconductor device and a method for producing the same.

2. Description of Related Art

An FPGA (Field Programmable Gate Array) is an LSI circuit that can be programmed freely in the field by a user.

The FPGA has logic blocks, and switch matrices. High-speed transistors and ultra-high-speed transistors are formed in each of the logic blocks. The switch matrices are provided to set routes of signals among the logic blocks. A large number of pass transistors are provided in each of the switch matrices.

In the semiconductor device according to the related art, there is however a problem that an output voltage of each pass transistor is lowered, i.e., each signal is attenuated.

SUMMARY

At least one embodiment of the present invention provides a semiconductor device including first transistors, second transistors, and third transistors lower in threshold voltage than at least the second transistors. Each such transistor includes a gate electrode, a gate insulating layer, a channel region, the channel region being formed in a semiconductor substrate. Peak concentrations of a first conductivity type impurity under center portions of the gate electrodes of the first transistors may be lower than peak concentrations of the first conductivity type impurity under center portions of the gate electrodes of the second transistors and not higher than peak concentrations of the first conductivity type impurity under center portions of the gate electrodes of the third transistors. Peak concentrations of the first conductivity type impurity under edge portions of the first gate electrodes may be higher than peak concentrations of the first conductivity type impurity under edge portions of the second gate electrodes and higher than peak concentrations of the first conductivity type impurity under edge portions of the third gate electrodes.

Other features and advantages of embodiments of the invention are apparent from the detailed specification and, thus, are intended to fall within the scope of the appended claims. Further, because numerous modifications and changes will be apparent to those skilled in the art based on the description herein, it is not desired to limit the embodiments of the invention to the exact construction and operation illustrated and described, and accordingly all suitable modifications and equivalents are included.

BRIEF DESCRIPTION OF THE DRAWINGS

FIG. 2 is a sectional view showing the semiconductor device according to an example embodiment of the present invention;

FIG. 3 is a view showing a concentration distribution of an acceptor impurity in a pass transistor according to an example embodying of the present invention;

FIG. 5 is a view showing a concentration distribution of an acceptor impurity in an ultra-high-speed transistor according to an example embodying of the present invention;

FIG. 6 is a graph showing the concentration distributions of the acceptor impurity under center portions of gate electrodes according to an example embodying of the present invention;

FIG. 7 is a graph showing the concentration distributions of the acceptor impurity under edge portions of the gate electrodes according to an example embodying of the present invention;

FIG. 8 is a graph showing the relationship between OFF current and output voltage according to an example embodying of the present invention; and FIGS. 9A, 9B, 10A, 10B, 11A, 11B, 12A, 12B, 13A, 13B, 14A, 14B and 15 sectional process views showing a semiconductor device producing method according to an example embodiment of the present invention.

Figure 1A:
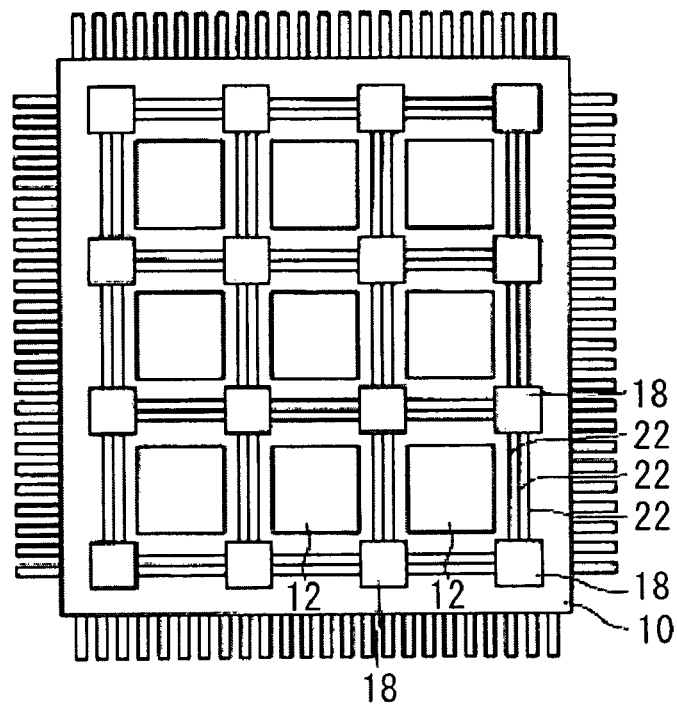
FIGS. 1A to 1C are schematic diagrams showing a semiconductor device according to an example embodiment of the present invention.

In the drawings, relative thicknesses and positioning of layers or regions may be reduced or exaggerated for clarity. In other words, the figures are not drawn to scale. Further, a layer is considered as being formed "on" another layer or a substrate when formed either directly on the referenced layer or the substrate or formed on other layers or patterns overlaying the referenced layer.

DESCRIPTION OF THE EXAMPLE EMBODIMENTS

Among other things, the following description discusses ranges in the sense of attributing numerical values to a parameter, e.g., a thickness, t, is about 5 nm, where 5 nm is the explicitly recited numerical value. Such range should be understood as describing values substantially equally to the explicit numerical value as well as the exact numerical value.

Without being bound by theory, in the semiconductor device according to the related art, the impurity concentration in a channel region (doped channel layer) of each pass transistor was set at a relatively high value to reduce an OFF current in the pass transistor. For this reason, an output voltage of the pass transistor was lowered.

Without being bound by theory, applying a relatively high voltage to a gate electrode of each pass transistor (overdrive mode) was thought by the Related Art to be a method of improving the output voltage of the pass transistor while reducing the OFF current in the pass transistor. The relatively high voltage applied to the gate electrode of each pass transistor, however, causes increase of a gate leak current when the voltage is applied to the gate electrode of the pass transistor. The Related Art thought that setting the thickness of a gate insulating film of each pass transistor at a large value would prevent the gate leak current from increasing in the pass transistor.

For the purpose of setting the thickness of the gate insulating film of the pass transistor at a large value, the Related Art thought it was however necessary to form the gate insulating film of the pass transistor in another process than the process of forming a gate insulating film of each high-speed transistor and the process of forming a gate insulating film of each ultra-high-speed transistor. This causes an undesirable increase in the number of manufacturing processes being used.

At least one embodiment of the present invention provides a technique which can suppress lowering of the output voltage of the pass transistor few, if any, disadvantage such as an increase of the OFF current, an increase of the gate leak current, an increase in the number of manufacturing processes being used, etc.

Figure 1B:
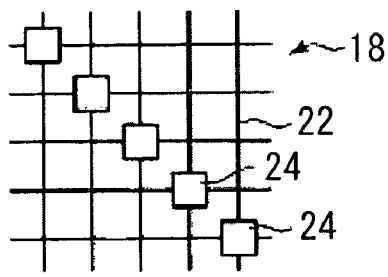
Figure 1C:
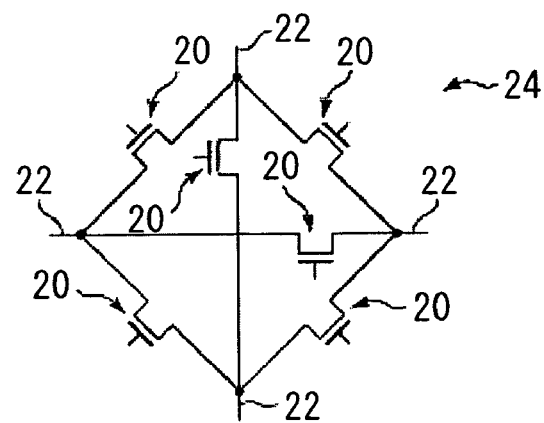

At least one semiconductor device and at least one method for producing the same according to example embodiments of the present invention will be described with reference to FIGS. 1 to 15. FIGS. 1A to 1C are schematic diagrams showing the semiconductor device according to an example embodiment of the present invention. FIG. 2 is a sectional view showing a semiconductor device according to an example embodiment of the present invention.

Although description will be made on the case where the principle of this embodiment is applied to an FPGA (Field Programmable Gate Array) by way of example, the principle of this embodiment can be applied to any other semiconductor devices as well as the FPGA.

As shown in FIG. 1A, logic blocks 12 are formed on a semiconductor substrate 10. High-speed transistors (HS transistors) 14 (see FIG. 2) and ultra-high-speed transistors (UHS transistors) 16 (see FIG. 2) are formed in each of the logic blocks 12. The ultra-high-speed transistors 16 are transistors high in operating speed compared with the high-speed transistors 14. The threshold voltage of each ultra-high-speed transistor 16 is lower than that of each high-speed transistor 14. The ON current of each ultra-high-speed transistor 16 is larger than that of each high-speed transistor 14. The OFF current of each ultra-high-speed transistor 16 is larger than that of each high-speed transistor 14.

Switch matrices 18 are formed around each logic block 12.

FIG. 1B is a conceptual diagram showing one of the switch matrices 18. Signal route setting portions 24 for setting signal routes are provided in regions of intersection of wirings 22, respectively.

FIG. 1C is a circuit diagram showing one of the signal route setting portions 24.

Pass transistors (pass gates) 20 are formed in each signal route setting portion 24. The pass transistors 20 serve, e.g., as switches for setting signal routes among the logic blocks 12. The pass transistors 20 are controlled by an SRAM (not shown) provided for controlling the pass transistors 20. The SRAM sets each pass transistor in an ON or OFF state appropriately.

A left part of FIG. 2 shows a pass transistor-forming region 2. A center part of FIG. 2 shows a high-speed transistor-forming region 4. A right part of FIG. 2 shows an ultra-high-speed transistor-forming region 6.

Each pass transistor 20 will be described first.

For example, a well 26a of a first conductivity type is formed in the semiconductor substrate 10 in the pass transistor-forming region 2. For example, a P-type silicon substrate is used as the semiconductor substrate 10 of the first conductivity type. For example, boron (B) is used as a dopant impurity of the first conductivity type. The peak concentration of boron in the well 26a of the first conductivity type is $9\times10^{17}$ $cm^{-3}$. For example, the concentration peak of boron in the well 26a of the first conductivity type is located at a depth of about 550 nm from an upper surface of the semiconductor substrate.

A gate electrode 30a is formed, through a gate insulating layer, e.g., film 28a, on the semiconductor substrate 10 in the pass transistor-forming region 2. For example, the thickness of the gate insulating film 28a is about 2 nm.

A doped channel layer (channel region) 32a of the first conductivity type is formed in the semiconductor substrate 10 and below the gate electrode 30a. For example, indium (In) is used as a dopant impurity of the first conductivity type imported into the doped channel layer 32a.

Pocket regions 34a of the first conductivity type are formed in the semiconductor substrate 10 so that the channel region 32a is put between the pocket regions 34a. The pocket regions 34a are formed so as to be self-aligned with the gate electrode 30a. For example, indium is used as a dopant impurity of the first conductivity type imported into the pocket regions 34a.

Impurity diffusion regions (extension regions) 36a of a second conductivity type formed to be self-aligned with the gate electrode 30a are formed in the semiconductor substrate 10 and on opposite sides of the gate electrode 30a. For example, As (arsenic) is used as a dopant impurity of the second conductivity type imported into the extension regions 36a.

The pocket regions 34a are located between the channel region 32a and the extension regions 36a.

A silicon oxide layer, e.g., film, 38 is formed in a sidewall portion of the gate electrode 30a. The silicon oxide film 38 forms a part of a sidewall insulating layer, e.g., film, 42.

A silicon nitride layer, e.g., film, 40 is formed in the sidewall portion of the gate electrode 30a where the silicon oxide film 38 has been formed. The silicon oxide film 38 and the silicon nitride film 40 make up, i.e., make up, the sidewall insulating film 42.

Impurity diffusion regions 44a of the second conductivity type formed to be self-aligned with both the gate electrode 30a and the sidewall insulating film 42 are formed in the semiconductor substrate 10 and on opposite sides of the gate electrode 30a where the sidewall insulating film 42 has been formed. For example, phosphorus (P) is used as a dopant impurity of the second conductivity type imported into the impurity diffusion regions 44a. The impurity diffusion regions 44a form deep regions of source/drain diffusion layers 46a having extension source/drain structures. In this manner, the impurity diffusion regions 36a and the impurity diffusion regions 44a make up the source/drain diffusion layers 46a having extension source/drain structures.

The concentration of the impurity of the first conductivity type in the doped channel layer 32a of the pass transistor 20 is set at a relatively low value. Accordingly, the peak concentration of indium just under a center portion of the gate electrode 30a, i.e., just under a lengthwise center line of the gate electrode 30a is, for example, about $1.4\times10^{18}$ $cm^{-3}$. The concentration peak of indium just under the center portion of the gate electrode 30a is located at a depth of about 20 nm from the upper surface of the semiconductor substrate 10.

The concentration of the impurity of the first conductivity type in the pocket regions 34a of the pass transistor 20 is set at a relatively high value, and the depth of the pocket regions 34a of the pass transistor 20 is set at a relatively small value. Accordingly, the peak concentration of indium just under an edge portion of the gate electrode 30a is, for example, about $1.8\times10^{19}$ $cm^{-3}$. The concentration peak of indium just under the edge portion of the gate electrode 30a is located at a depth of about 10 nm from the upper surface of the semiconductor substrate 10.

A silicide layer, e.g., film, 47a, for example, made of cobalt silicide is formed on an upper portion of the gate electrode 30a.

Silicide layers, e.g., films, 47b, for example, made of cobalt silicide are formed on upper portions of the source/drain diffusion layers 46a respectively. The silicide films 47b serve as source/drain electrodes.

The pass transistor 20 is formed in the aforementioned manner.

Each high-speed transistor 14 will be described next.

For example, a well 26b of a first conductivity type is formed in the semiconductor substrate 10 in each high-speed transistor-forming region 4. For example, boron is used as an impurity of the first conductivity type. The peak concentration of boron in the well 26b of the first conductivity type is about $9 \times 10^{17}$ cm$^{-3}$. For example, the concentration peak of boron in the well 26b of the first conductivity type is located at a depth of about 550 nm from the upper surface of the semiconductor substrate 10.

A gate electrode 30b is formed, through a gate insulating layer, e.g., film, 28b, on the semiconductor substrate 10 in the high-speed transistor-forming region 4. The thickness of the gate insulating film 28b of the high-speed transistor 14 is, for example, about 2 nm. That is, the thickness of the gate insulating film 28b of the high-speed transistor 14 is at least substantially equal to that of the gate insulating film 28a of the pass transistor 20.

A doped channel layer (channel region) 32b of the first conductivity type is formed in the semiconductor substrate 10 and below the gate electrode 30b. For example, indium is used as a dopant impurity of the first conductivity type imported into the doped channel layer 32b.

Pocket regions 34b of the first conductivity type are formed in the semiconductor substrate 10 so that the channel region 32b is put between the pocket regions 34b. The pocket regions 34b are formed so as to be self-aligned with the gate electrode 30b. For example, indium is used as a dopant impurity of the first conductivity type imported into the pocket regions 34b.

Impurity diffusion regions (extension regions) 36b of a second conductivity type formed to be self-aligned with the gate electrode 30b are formed in the semiconductor substrate 10 and on opposite sides of the gate electrode 30b. For example, arsenic is used as a dopant impurity of the second conductivity type imported into the extension regions 36b.

The pocket regions 34b are located between the channel region 32b and the extension regions 36b.

A sidewall insulating film 42 made up of a silicon oxide film 38 and a silicon nitride film 40 is formed in a sidewall portion of the gate electrode 30b.

Impurity diffusion regions 44b of the second conductivity type formed to be self-aligned with both the gate electrode 30b and the sidewall insulating film 42 are formed in the semiconductor substrate 10 and on opposite sides of the gate electrode 30b where the sidewall insulating film 42 has been formed. For example, phosphorus is used as a dopant impurity of the second conductivity type imported into the impurity diffusion regions 44b. The impurity diffusion regions 44b form deep regions of source/drain diffusion layers 46b having extension source/drain structures. In this manner, the impurity diffusion regions 36b and the impurity diffusion regions 44b make up the source/drain diffusion layers 46b having extension source/drain structures.

The concentration of the impurity of the first conductivity type in the doped channel layer 32b of the high-speed transistor 14 is set at a relatively high value. Accordingly, the peak concentration of indium just under a center portion of the gate electrode 30b, i.e., just under a lengthwise center line of the gate electrode 30b is, for example, about $3.2 \times 10^{18}$ cm$^{-3}$. The concentration peak of indium just under the center portion of the gate electrode 30b is located at a depth of about 32 nm from the upper surface of the semiconductor substrate 10.

The concentration of the impurity of the first conductivity type in the pocket regions 34b of the high-speed transistor 14 is set at a relatively low value, and the depth of the pocket regions 34b of the high-speed transistor 14 is set at a relatively large value. Accordingly, the peak concentration of indium just under an edge portion of the gate electrode 30b is, for example, about $6.5 \times 10^{18}$ cm$^{-3}$. The concentration peak of indium just under the edge portion of the gate electrode 30b is located at a depth of about 12 nm from the upper surface of the semiconductor substrate 10.

A silicide film 47a, for example, made of cobalt silicide is formed on an upper portion of the gate electrode 30b.

Silicide films 47b, for example, made of cobalt silicide are formed on upper portions of the source/drain diffusion layers 46b respectively. The silicide films 47b serve as source/drain electrodes.

The high-speed transistor 14 is formed in the aforementioned manner.

Each ultra-high-speed transistor 16 will be described next.

For example, a well 26c of a first conductivity type is formed in the semiconductor substrate 10 in each ultra-high-speed transistor-forming region 6. For example, boron is used as an impurity of the first conductivity type. The peak concentration of boron in the well 26c of the first conductivity type is about $9 \times 10^{17}$ cm$^{-3}$. For example, the concentration peak of boron in the well 26c of the first conductivity type is located at a depth of about 550 nm from the upper surface of the semiconductor substrate 10.

A gate electrode 30c is formed on a gate insulating layer, e.g., film, 28c, with the latter being formed on the semiconductor substrate 10 in the ultra-high-speed transistor-forming region 6. The thickness of the gate insulating film 28c of the ultra-high-speed transistor 16 is, for example, about 2 nm. That is, the thickness of the gate insulating film 28c of the ultra-high-speed transistor 16 is at least substantially equal to that of the gate insulating film 28a of the pass transistor 20 and to that of the thickness of the gate insulating film 28b of the high-speed transistor 14.

A doped channel layer (channel region) 32c of the first conductivity type is formed in the semiconductor substrate 10 and below the gate electrode 30c. For example, indium is used as a dopant impurity of the first conductivity type imported into the doped channel layer 32c.

Pocket regions 34c of the first conductivity type are formed in the semiconductor substrate 10 so that the channel region 32c is put between the pocket regions 34c. The pocket regions 34c are formed so as to be self-aligned with the gate electrode 30c. For example, indium is used as a dopant impurity of the first conductivity type imported into the pocket regions 34c.

Impurity diffusion regions (extension regions) 36c of a second conductivity type formed to be self-aligned with the gate electrode 30c are formed in the semiconductor substrate 10 and on opposite sides of the gate electrode 30c. For example, arsenic is used as a dopant impurity of the second conductivity type imported into the extension regions 36c.

The pocket regions 34c are located between the channel region 32c and the extension regions 36c.

A sidewall insulating film 42 made up of a silicon oxide film 38 and a silicon nitride film 40 is formed in a sidewall portion of the gate electrode 30c.

Impurity diffusion regions 44c of the second conductivity type formed to be self-aligned with both the gate electrode 30c and the sidewall insulating film 42 are formed in the semiconductor substrate 10 and on opposite sides of the gate electrode 30c where the sidewall insulating film 42 has been formed. For example, phosphorus may be used as a dopant impurity of the second conductivity type imported into the impurity diffusion regions 44c. The impurity diffusion regions 44c form deep regions of source/drain diffusion layers 46c having extension source/drain structures. In this manner, the impurity diffusion regions 36c and the impurity diffusion regions 44c make up the source/drain diffusion layers 46c having extension source/drain structures.

The concentration of the impurity of the first conductivity type in the doped channel layer 32c of the ultra-high-speed transistor 16 is set at a relatively low value. Accordingly, the peak concentration of indium just under a center portion of the gate electrode 30c, i.e., just under a lengthwise center line of the gate electrode 30c is, for example, about $2.2 \times 10^{18}$ cm$^{-3}$. The concentration peak of indium just under the center portion of the gate electrode 30c is located at a depth of about 32 nm from the upper surface of the semiconductor substrate 10.

The concentration of the impurity of the first conductivity type in the pocket regions 34c of the ultra-high-speed transistor 16 is set at a relatively low value, and the depth of the pocket regions 34c of the ultra-high-speed transistor 16 is set at a relatively large value. Accordingly, the peak concentration of indium just under an edge portion of the gate electrode 30c is, for example, about $5.0 \times 10^{18}$ cm$^{-3}$. The concentration peak of indium just under the edge portion of the gate electrode 30c is located at a depth of about 11 nm from the upper surface of the semiconductor substrate 10.

A silicide film 47a, for example, made of cobalt silicide is formed on an upper portion of the gate electrode 30c.

Silicide films 47b, for example, made of cobalt silicide are formed on upper portions of the source/drain diffusion layers 46c respectively. The silicide films 47b serve as source/drain electrodes.

The ultra-high-speed transistor 16 is formed in the aforementioned manner.

As described above, in accordance with this embodiment, the concentration of the impurity of the first conductivity type in the doped channel layer 32a of the first conductivity type in each pass transistor 20 is set at a relatively low value. For this reason, the peak concentration of indium just under the center portion of the gate electrode 30a of the pass transistor 20 is lower than the peak concentration of indium just under the center portion of the gate electrode 30b of the high-speed transistor 14 and not higher than the peak concentration of indium just under the center portion of the gate electrode 30c of the ultra-high-speed transistor 16.

In this embodiment, the pocket regions 34a of the first conductivity type in the pass transistor 20 are formed so as to be relatively shallow. For this reason, the depth of the concentration peak of indium just under the edge portion of the gate electrode 30a of the pass transistor 20 is smaller than the depth of the concentration peak of indium just under the edge portion of the gate electrode 30b of the high-speed transistor 14 and smaller than the depth of the concentration peak of indium just under the edge portion of the gate electrode 30c of the ultra-high-speed transistor 16.

In this embodiment, the pocket regions 34a of the first conductivity type in the pass transistor 20 are formed so that the concentration of indium therein becomes relatively high. For this reason, the peak concentration of indium just under the edge portion of the gate electrode 30a of the pass transistor 20 is higher than the peak concentration of indium just under the edge portion of the gate electrode 30b of the high-speed transistor 14 and higher than the peak concentration of indium just under the edge portion of the gate electrode 30c of the ultra-high-speed transistor 16.

FIG. 3 is a view showing a concentration distribution of an acceptor impurity in the pass transistor.

Figure 4:
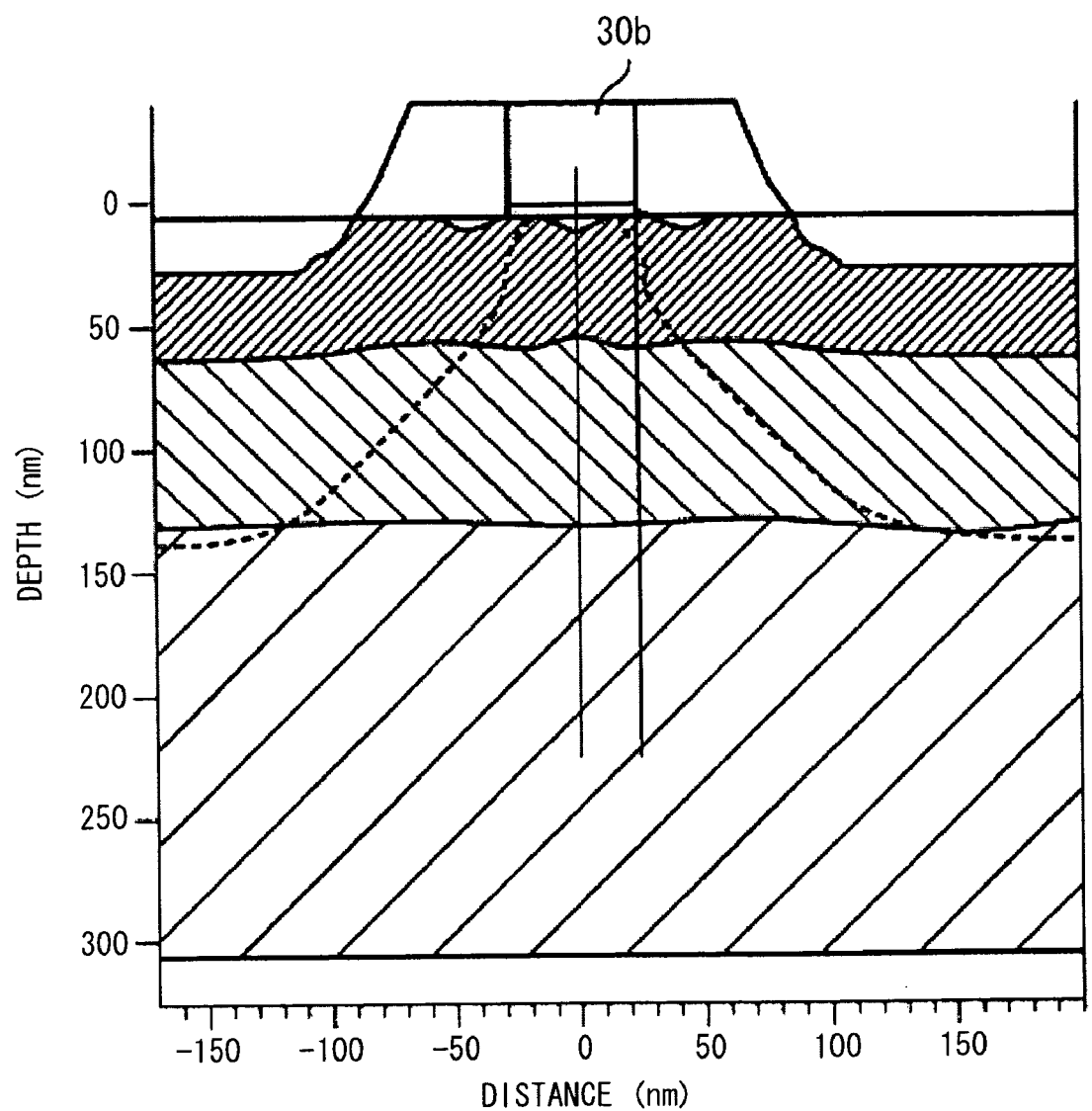
FIG. 4 is a view showing a concentration distribution of an acceptor impurity in a high-speed transistor according to an example embodying of the present invention.

FIG. 4 is a view showing a concentration distribution of an acceptor impurity in the high-speed transistor.

FIG. 5 is a view showing a concentration distribution of an acceptor impurity in the ultra-high-speed transistor.

FIG. 6 is a graph showing concentration distributions of an acceptor impurity just under the center portions of the gate electrodes. In FIG. 6, the concentration distribution of the acceptor impurity represented by the solid line shows the case of the pass transistor 20. In FIG. 6, the concentration distribution of the acceptor impurity represented by the broken line shows the case of the high-speed transistor 14. In FIG. 6, the concentration distribution of the acceptor impurity represented by the one-dot chain line shows the case of the ultra-high-speed transistor 16.

FIG. 7 is a graph showing concentration distributions of an acceptor impurity just under the edge portions of the gate electrodes. In FIG. 7, the concentration distribution of the acceptor impurity represented by the solid line shows the case of the pass transistor 20. In FIG. 7, the concentration distribution of the acceptor impurity represented by the broken line shows the case of the high-speed transistor 14. In FIG. 7, the concentration distribution of the acceptor impurity represented by the one-dot chain line shows the case of the ultra-high-speed transistor 16.

As should be understood from FIGS. 3 to 6, the peak concentration of the acceptor impurity just under the center portion of the gate electrode 30a of the pass transistor 20 is lower than the peak concentration of the acceptor impurity just under the center portion of the gate electrode 30b of the high-speed transistor 14. The peak concentration of the acceptor impurity just under the center portion of the gate electrode 30a of the pass transistor 20 is not higher than the peak concentration of the acceptor impurity just under the center portion of the gate electrode 30c of the ultra-high-speed transistor 16.

As should be understood from FIG. 7, the peak concentration of the acceptor impurity just under the edge portion of the gate electrode 30a of the pass transistor 20 is higher than the peak concentration of the acceptor impurity just under the edge portion of the gate electrode 30b of the high-speed transistor 14. The peak concentration of the acceptor impurity just under the edge portion of the gate electrode 30a of the pass transistor 20 is also higher than the peak concentration of the acceptor impurity just under the edge portion of the gate electrode 30c of the ultra-high-speed transistor 16.

As should be understood from FIG. 7, the depth of the concentration peak of the acceptor impurity just under the edge portion of the gate electrode 30a of the pass transistor 20 is smaller than the depth of the concentration peak of the acceptor impurity just under the edge portion of the gate electrode 30b of the high-speed transistor 14. The depth of the concentration peak of the acceptor impurity just under the edge portion of the gate electrode 30a of the pass transistor 20 is also smaller than the depth of the concentration peak of the acceptor impurity just under the edge portion of the gate electrode 30c of the ultra-high-speed transistor 16.

An evaluation result of the semiconductor device according to an example embodiment of the present invention will be described next with reference to FIG. 8.

FIG. 8 is a graph showing the relationship between OFF current and output voltage. In FIG. 8, the horizontal axis expresses values of the OFF current of each transistor when the transistor is supplied with a drain voltage of 1.2 V, a gate voltage of 0 V, a source voltage of 0 V and a substrate voltage of 0 V. In FIG. 8, the vertical axis expresses the source voltage, i.e., the output voltage of each transistor when the transistor is supplied with a drain voltage of 1.2 V, a gate voltage of 1.2 V and a substrate voltage of 0 V.

In FIG. 8, plots represented by the symbol Δ show the case of a first example, namely Example 1. In Example 1, conditions for importing the dopant impurity into the doped channel layer were set as follows. Indium was used as the dopant impurity. The dose quantity of the dopant impurity was set at $8\times10^{12}$ cm$^{-2}$. The acceleration voltage was set at 185 keV. The incidence angle of the dopant impurity was set at 7 degrees with respect to a normal line to the substrate surface. In Example 1, conditions for importing the dopant impurity into the pocket regions were set as follows. Indium was used as the dopant impurity. The dose quantity of the dopant impurity was changed appropriately. The acceleration voltage was set at 10 keV. The incidence angle of the dopant impurity was set at 28 degrees with respect to a normal line to the substrate surface.

In FIG. 8, plots represented by the symbol ○ show the case of a second example, namely Example 2. In Example 2, conditions for importing the dopant impurity into the doped channel layer were set as follows. Indium was used as the dopant impurity. The dose quantity of the dopant impurity was set at $8\times10^{12}$ cm$^{-2}$. The acceleration voltage was set at 185 keV. The incidence angle of the dopant impurity was set at 7 degrees with respect to a normal line to the substrate surface. In Example 2, conditions for importing the dopant impurity into the pocket regions were set as follows. Indium was used as the dopant impurity. The dose quantity of the dopant impurity was changed appropriately. The acceleration voltage was set at 20 keV. The incidence angle of the dopant impurity was set at 28 degrees with respect to a normal line to the substrate surface.

In FIG. 8, plots represented by the symbol \ show the case of a third example, namely Example 3. In Example 3, conditions for importing the dopant impurity into the doped channel layer were set as follows. Indium was used as the dopant impurity. The dose quantity of the dopant impurity was set at $8\times10^{12}$ cm$^{-2}$. The acceleration voltage was set at 185 keV. The incidence angle of the dopant impurity was set at 7 degrees with respect to a normal line to the substrate surface. In Example 3, conditions for importing the dopant impurity into the pocket regions were set as follows. Indium was used as the dopant impurity. The dose quantity of the dopant impurity was changed appropriately. The acceleration voltage was set at 40 keV. The incidence angle of the dopant impurity was set at 28 degrees with respect to a normal line to the substrate surface.

In FIG. 8, plots represented by the symbol ♦ show the case of a comparative example, namely Comparative Example 1. In Comparative Example 1, conditions for importing the dopant impurity into the doped channel layer were set as follows. Indium was used as the dopant impurity. The dose quantity of the dopant impurity was changed appropriately. The acceleration voltage was set at 185 keV. The incidence angle of the dopant impurity was set at 7 degrees with respect to a normal line to the substrate surface. In Comparative Example 1, conditions for importing the dopant impurity into the pocket regions were set as follows. The dose quantity of the dopant impurity was changed appropriately. Indium was used as the dopant impurity. The acceleration voltage was set at 40 keV. The incidence angle of the dopant impurity was set at 28 degrees with respect to a normal line to the substrate surface. Incidentally, the transistor according to Comparative Example 1 is equivalent to an ultra-high-speed transistor.

In FIG. 8, plots represented by the symbol ■ show the case of a comparative example, namely Comparative Example 2. In Comparative Example 2, conditions for importing the dopant impurity into the doped channel layer were set as follows. Indium was used as the dopant impurity. The dose quantity of the dopant impurity was changed appropriately. Injection of the dopant impurity into the doped channel layer was divided in two times so that the acceleration voltage for the first importation of the dopant impurity was set at 135 keV and the acceleration voltage for the second importation of the dopant impurity was set at 100 keV. The incidence angle of the dopant impurity was set at 7 degrees with respect to a normal line to the substrate surface. In Comparative Example 2, conditions for importing the dopant impurity into the pocket regions were set as follows. Indium was used as the dopant impurity. The dose quantity of the dopant impurity was changed appropriately. The acceleration voltage was set at 40 keV. The incidence angle of the dopant impurity was set at 28 degrees with respect to a normal line to the substrate surface. Incidentally, the transistor according to Comparative Example 2 is equivalent to a high-speed transistor.

As shown in FIG. 8, in the cases of Comparative Examples 1 and 2, the output voltage of the transistor is reduced remarkably as the OFF current is reduced. For example, in Comparative Example 2, the output voltage is reduced by 130 mV when the OFF current is reduced to $1\times10^{-9}$ A/μm.

On the contrary, in the case of this embodiment, i.e., in the cases of Examples 1 to 3, reduction in the output voltage of the transistor is relatively small even when the OFF current is reduced. For example, in Example 1, the output voltage is reduced by only 38 mV even when the OFF current is reduced to $1\times10^{-9}$ A/μm.

It is should be understood from these facts that, in accordance with this embodiment, reduction in the output voltage of each pass transistor 20 can be suppressed, if not prevented, while the OFF current of the pass transistor 20 is reduced.

As described above, in accordance with this embodiment, the concentration of the impurity of the first conductivity type in the doped channel layer 32*a* of the first conductivity type in the pass transistor 20 is set at a relatively low value, and the pocket regions 34*a* of the first conductivity type in the pass transistor 20 are formed so as to be relatively shallow with a relatively high impurity concentration. Because the concentration of the impurity of the first conductivity type in the doped channel layer 32*a* of the first conductivity type is set at a relatively low value and the pocket regions 34*a* are formed so as to be relatively shallow, reduction in the output signal of the pass transistor 20 can be suppressed, if not prevented. Moreover, since the pocket regions 34*a* of the first conductivity type are formed with a relatively high impurity concentration, the threshold voltage of the pass transistor 20 can be set at a relatively high value and, accordingly, the OFF current can be reduced. For this reason, in accordance with this embodiment, reduction in the output voltage of the pass transistor can be suppressed, if not prevented, while the OFF current of the pass transistor is reduced.

In this embodiment, a relatively high voltage need not be applied to the gate electrode 30*a* of the pass transistor 20 in order to suppress, if not prevent, a lowering of the output voltage of the pass transistor 20. Accordingly, the gate insulating film 28*a* of the pass transistor 20 need not be set to be thicker than the gate insulating film 28*b* of the high-speed transistor 14 and the gate insulating film 28*c* of the ultra-high-speed transistor 16. For this reason, in accordance with this embodiment, the gate insulating film 28*a* of the pass transistor 20, the gate insulating film 28*b* of the high-speed transistor 14 and the gate insulating film 28*c* of the ultra-high-speed transistor 16 can be formed by one process, so that an increase in the number of processes can be suppressed, if not prevented. For this reason, this embodiment can contribute to reduction in cost.

Incidentally, since such a high operating speed as required of the high-speed transistor 14 or of the ultra-high-speed transistor 16 is not required of the pass transistor 20, there is no particular problem even when the pocket regions 34a are formed so as to be relatively shallow with a relatively high impurity concentration.

A method for producing a semiconductor device according to an example embodiment of the present invention will be described next with reference to FIGS. 9A, 9B, 10A, 10B, 11A, 11B, 12A, 12B, 13A, 13B, 14A, 14B and 15 which are sectional views. In each of FIGS. 9A, 9B, 10A, 10B, 11A, 11B, 12A, 12B, 13A, 13B, 14A, 14B and 15 the left part shows a pass transistor-forming region 2. In each of FIGS. 9A, 9B, 10A, 10B, 11A, 11B, 12A, 12B, 13A, 13B, 14A, 14B and 15 the center part shows a high-speed transistor-forming region 4. In each of FIGS. 9A, 9B, 10A, 10B, 11A, 11B, 12A, 12B, 13A, 13B, 14A, 14B and 15 the right part shows an ultra-high-speed transistor-forming region 6.

Figure 9A:
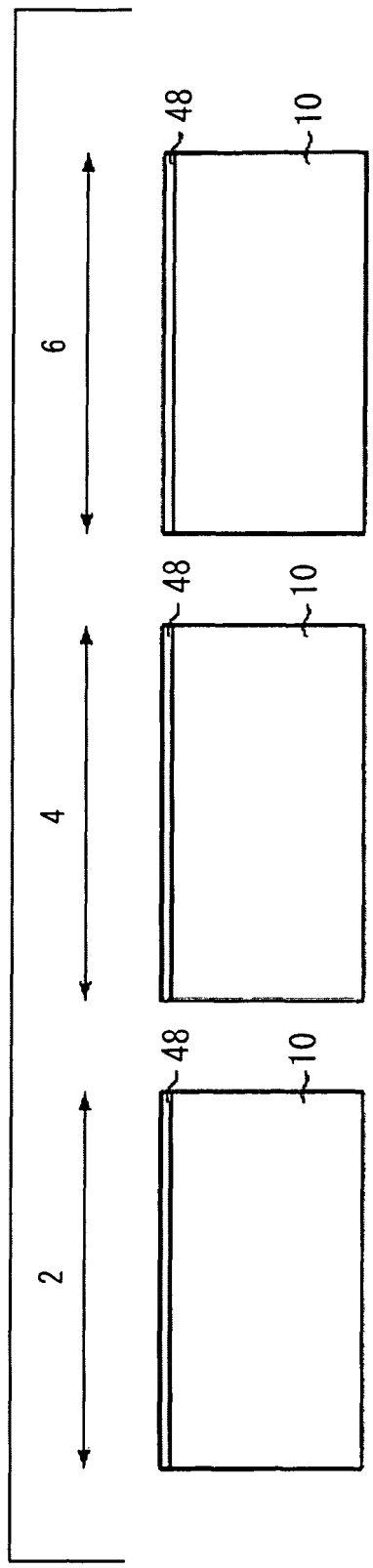

First, as shown in FIG. 9A, a sacrificial oxide layer, e.g., film, 48 having a thickness of about 10 nm is formed on an upper surface of a semiconductor substrate 10 of a first conductivity type by a thermal oxidation method. For example, a P-type silicon substrate is used as the semiconductor substrate 10 of the first conductivity type. For example, the specific resistance of the silicon substrate 10 is about 10 Ω$\mu$m.

Figure 9B:
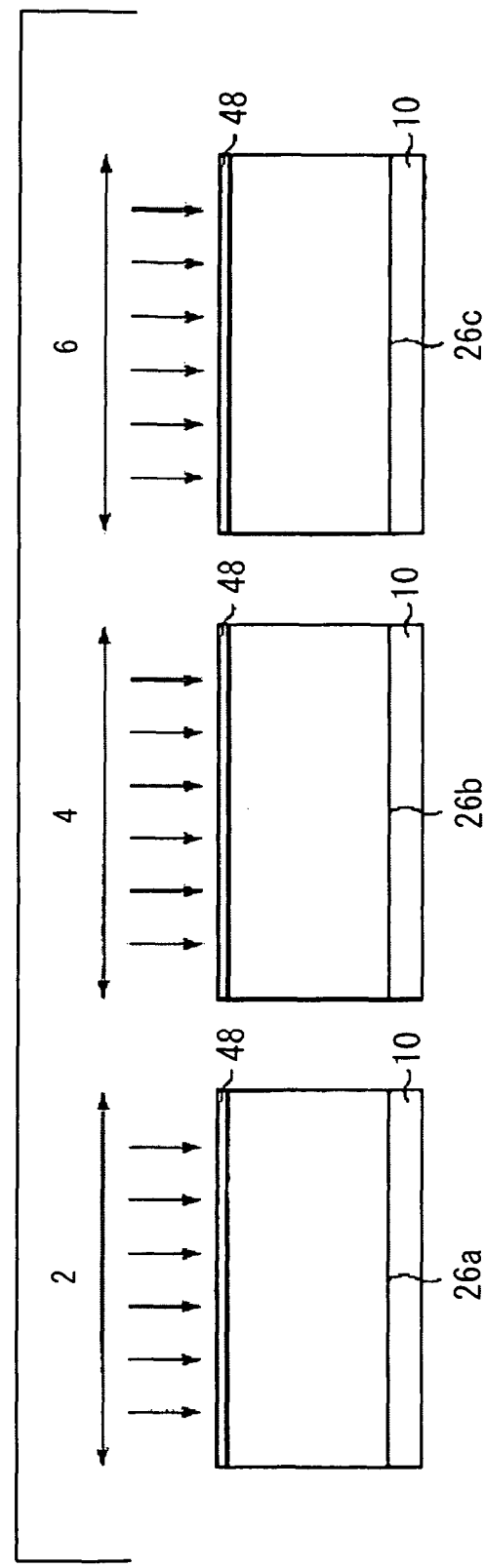
Figure 15:
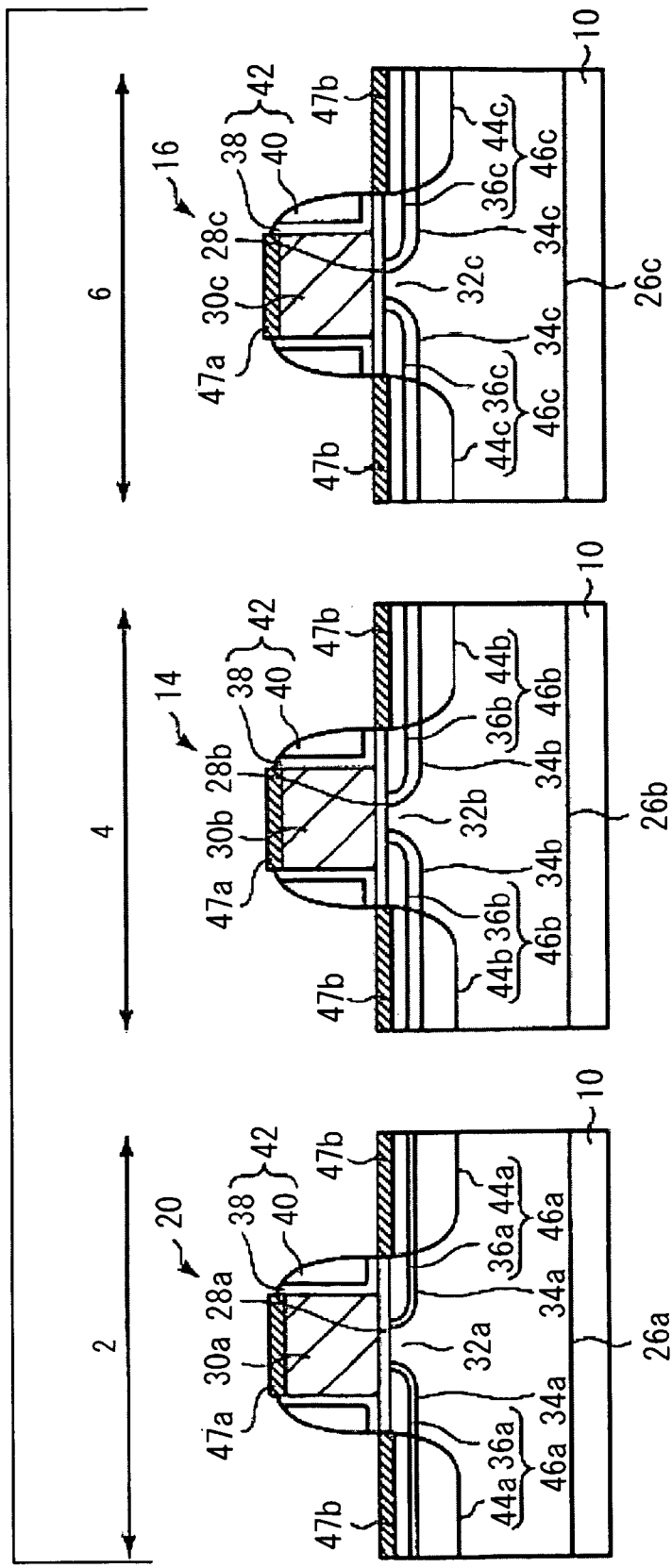

Next, as shown in FIG. 9B, a dopant impurity of the first conductivity type is imported into the semiconductor substrate 10 in the pass transistor-forming region 2, the high-speed transistor-forming region 4 and the ultra-high-speed transistor-forming region 6 by an ion injection method. For example, boron is used as the dopant impurity of the first conductivity type. For example, conditions for injection of boron may include the following. For example, the acceleration voltage is 170 keV. For example, the dose quantity of boron is about $3.5\times10^{13}$ cm$^{-2}$. In this manner, a well 26a of the first conductivity type is formed in the semiconductor substrate 10 in the pass transistor-forming region 2, a well 26b of the first conductivity type is formed in the semiconductor substrate 10 in the high-speed transistor-forming region 4, and a well 26c of the first conductivity type is formed in the semiconductor substrate 10 in the ultra-high-speed transistor-forming region 6. When boron is injected under the aforementioned conditions, the peak concentration of boron becomes about $2\times10^{18}$ cm$^{-3}$. The concentration peak of boron is located at a depth of about 550 nm from the upper surface of the semiconductor substrate 10. The peak concentrations of boron in the pass transistor-forming region 2, the high-speed transistor-forming region 4 and the ultra-high-speed transistor-forming region 6 become equal to one another. The depths of the concentration peak of boron in the pass transistor-forming region 2, the high-speed transistor-forming region 4 and the ultra-high-speed transistor-forming region 6 become equal to one another.

A photoresist layer, e.g., film, 50 is then formed on the whole upper surface of the semiconductor substrate 10 by a spin coating method.

An opening portion (not shown) for exposing the high-speed transistor-forming region is then formed in the photoresist film 50 by photolithography.

A dopant impurity of the first conductivity type is then imported into the semiconductor substrate 10 masked with the photoresist film 50 by an ion injection method (see FIG. 10A). For example, indium is used as the dopant impurity of the first conductivity type. The injection of indium is divided in two times. For example, conditions for the first indium injection may include the following. For example, the acceleration voltage is 135 keV. For example, the dose quantity of indium is about $6\times10^{12}$ cm$^{-2}$. For example, the incidence angle of indium is 7 degrees with respect to a normal line to the upper surface of the semiconductor substrate 10. For example, conditions for the second indium injection may include the following. For example, the acceleration voltage is 100 keV. For example, the dose quantity of indium is about $1\times10^{13}$ cm$^{-2}$. For example, the incidence angle of indium is 7 degrees with respect to a normal line to the upper surface of the semiconductor substrate 10. When indium is injected under the aforementioned conditions, the peak concentration of indium becomes, for example, about $4\times10^{18}$ cm$^{-3}$. The concentration peak of indium is located at a depth of about 40 nm from the upper surface of the semiconductor substrate 10. In this manner, a doped channel layer 32b is formed in the high-speed transistor-forming region 4. The photoresist film 50 is then peeled.

A photoresist layer, e.g., film, 52 is then formed on the whole upper surface of the semiconductor substrate 10 by a spin coating method.

An opening portion (not shown) for exposing the pass transistor-forming region 2 and an opening portion (not shown) for exposing the ultra-high-speed transistor-forming region 6 are then formed in the photoresist film 52 by photolithography.

A dopant impurity of the first conductivity type is then imported into the semiconductor substrate 10 masked with the photoresist film 52 by an ion injection method (see FIG. 10B). For example, indium is used as the dopant impurity of the first conductivity type. For example, conditions for injection of indium may include the following. For example, the acceleration voltage is 185 keV. For example, the dose quantity of indium is about $8\times10^{12}$ cm$^{-2}$. For example, the incidence angle of indium is 7 degrees with respect to a normal line to the upper surface of the semiconductor substrate 10. When indium is injected under the aforementioned conditions, the peak concentration of indium becomes, for example, about $1.2\times10^{18}$ cm$^{-3}$. The concentration peak of indium is located at a depth of about 80 nm from the upper surface of the semiconductor substrate. In this manner, a doped channel layer 32a is formed in the pass transistor-forming region 2 and a doped channel layer 32c is formed in the ultra-high-speed transistor-forming region 6. The photoresist film 52 is then peeled.

Then, as shown in FIG. 11A, the sacrificial oxide film 48 is removed from the upper surface of the semiconductor substrate 10 by hydrofluoric acid etching.

Then, as shown in FIG. 11B, a gate insulating layer, e.g., film, 28 is formed on the upper surface of the semiconductor substrate 10 by a thermal oxidation method. For example, the thickness of the gate insulating film 28 is about 2 nm. For example, after the gate insulating film 28 is formed, the peak concentrations of boron, the depths of the concentration peak of boron, the peak concentrations of indium and the depths of the concentration peak of indium may include the following. For example, the peak concentration of boron in each of the wells 26a to 26c is about $9\times10^{17}$ cm$^{-3}$. The concentration peak of boron in each of the wells 26a to 26c is located at a depth of about 550 nm from the upper surface of the semiconductor substrate 10. For example, the peak concentration of indium in each of the pass transistor-forming region 2 and the ultra-high-speed transistor-forming region 6 is about $8.6\times10^{17}$ cm$^{-3}$. The concentration peak of indium in each of the pass transistor-forming region 2 and the ultra-high-speed transistor-forming region 6 is located at a depth of about 60 nm from the upper surface of the semiconductor substrate 10. For example, the peak concentration of indium in the high-speed transistor-forming region 4 is about $4.2 \times 10^{17}$ cm$^{-3}$. The concentration peak of indium in the high-speed transistor-forming region 4 is located at a depth of about 80 nm from the upper surface of the semiconductor substrate 10.

A polysilicon layer, e.g., film, is then formed, for example, by a CVD method. For example, the thickness of the polysilicon film is about 10 nm.

The polysilicon film is then patterned by photolithography. In this manner, gate electrodes 30a to 30c of polysilicon are formed in the pass transistor-forming region 2, the high-speed transistor-forming region 4 and the ultra-high-speed transistor-forming region 6 respectively (see FIG. 12A).

A photoresist layer, e.g., film, 54 is then formed on the whole upper surface of the semiconductor substrate 10 by a spin coating method.

An opening portion (not shown) for exposing the high-speed transistor-forming region 4 and an opening portion (not shown) for exposing the ultra-high-speed transistor-forming region 6 are then formed in the photoresist film 54 by photolithography.

Then, as shown in FIG. 12B, a dopant impurity of the first conductivity type is imported into the semiconductor substrate 10 masked with the photoresist film 54 by an ion injection method. For example, indium is used as the dopant impurity of the first conductivity type. For example, conditions for injection of indium may include: the acceleration voltage may be 40 keV; the dose quantity of indium may be about $9 \times 10^{12}$ cm$^{-2}$; and the incidence angle of indium may be 28 degrees with respect to a normal line to the upper surface of the semiconductor substrate. Indium may be injected from, e.g., four directions.

After indium is injected under the aforementioned example conditions related to FIG. 12B, the peak concentrations of indium and the depths of the concentration peak of indium may be include: the concentration peak of indium just under a center portion of the gate electrode 30b in the high-speed transistor-forming region 4 may be about $2.4 \times 10^{18}$ cm$^{-3}$; the concentration peak of indium just under the center portion of the gate electrode 30b in the high-speed transistor-forming region 4 may be located at a depth of about 35 nm from the upper surface of the semiconductor substrate 10; the concentration peak of indium just under an edge portion of the gate electrode 30b in the high-speed transistor-forming region 4 may be about $8.3 \times 10^{18}$ cm$^{-3}$; the concentration peak of indium just under the edge portion of the gate electrode 30b in the high-speed transistor-forming region 4 may be located at a depth of about 33 nm from the upper surface of the semiconductor substrate 10; the concentration peak of indium just under a center portion of the gate electrode 30c in the ultra-high-speed transistor-forming region 6 may be about $1.3 \times 10^{18}$ cm$^{-3}$; the concentration peak of indium just under the center portion of the gate electrode 30c in the ultra-high-speed transistor-forming region 6 may be located at a depth of about 32 nm from the upper surface of the semiconductor substrate 10; the concentration peak of indium just under an edge portion of the gate electrode 30c in the ultra-high-speed transistor-forming region 6 may be about $7.3 \times 10^{18}$ cm$^{-3}$; and the concentration peak of indium just under the edge portion of the gate electrode 30c in the ultra-high-speed transistor-forming region 6 may be located at a depth of about 32 nm from the upper surface of the semiconductor substrate 10. In this manner, pocket regions 34b and 34c may be formed in the high-speed transistor-forming region 4 and the ultra-high-speed transistor-forming region 6 respectively. The photoresist film 54 is then peeled.

A photoresist layer, e.g., film, 56 is then formed on the whole upper surface of the semiconductor substrate 10 by a spin coating method.

An opening portion (not shown) for exposing the pass transistor-forming region 2 is then formed in the photoresist film 56 by photolithography.

Then, as shown in FIG. 13A, a dopant impurity of the first conductivity type is imported into the semiconductor substrate 10 masked with the photoresist film 56 by an ion injection method. For example, indium is used as the dopant impurity of the first conductivity type. For example, conditions for injection of indium may include the following. For example, the acceleration voltage may be about 10 keV. For example, the dose quantity of indium may be about $2.8 \times 10^{13}$ cm$^{-2}$. For example, the incidence angle of indium may be about 28 degrees with respect to a normal line to the upper surface of the semiconductor substrate 10. Indium may be injected from, e.g., four directions.

After indium is injected under the aforementioned conditions related to FIG. 13A, the peak concentration of indium and the depths of the concentration peak of indium in the pass transistor-forming region 2 may include: the concentration peak of indium just under a center portion of the gate electrode 30a in the pass transistor-forming region 2 may be about $7.6 \times 10^{17}$ cm$^{-3}$; the concentration peak of indium just under the center portion of the gate electrode 30a in the pass transistor-forming region 2 may be located at a depth of about 52 nm from the upper surface of the semiconductor substrate 10; the concentration peak of indium just under an edge portion of the gate electrode 30a in the pass transistor-forming region 2 may be about $6.6 \times 10^{19}$ cm$^{-3}$; and the concentration peak of indium just under the edge portion of the gate electrode 30a in the pass transistor-forming region 2 may be located at a depth of about 19 nm from the upper surface of the semiconductor substrate 10. In this manner, pocket regions 34a may be formed in the pass transistor-forming region 2. The photoresist film 56 is then peeled.

Then, as shown in FIG. 13B, a dopant impurity of a second conductivity type is imported into the semiconductor substrate 10 masked with the gate electrodes 30a to 30c by an ion injection method. For example, arsenic is used as the dopant impurity of the second conductivity type. For example, conditions for ion injection may be include: the acceleration voltage may be about 3 keV; the dose quantity of arsenic may be about $8 \times 10^{14}$ cm$^{-2}$; and the incidence angle of the dopant impurity may be about 0 degrees with respect to a normal line to the upper surface of the semiconductor substrate 10. In this manner, extension regions 36a to 36c may be formed in the semiconductor substrate 10 and on respective opposite sides of the gate electrodes 30a to 30c.

A silicon oxide layer, e.g., film, 38 is then formed on the whole upper surface of the semiconductor substrate 10, for example, by a CVD method. For example, a TEOS gas may be used as a raw material gas. For example, the substrate temperature may be about 650° C. For example, the thickness of the silicon oxide film 38 may be about 30 nm.

A silicon nitride film 40 is then formed on the whole upper surface of the semiconductor substrate 10, for example, by a CVD method. For example, the substrate temperature may be about 680° C. For example, the thickness of the silicon nitride film 40 may be about 60 nm.

The silicon oxide film 38 and the silicon nitride film 40 are then subjected to anisotropic etching. As a result, sidewall insulating films 42 made up of the silicon oxide film 38 and the silicon nitride film 40 are formed (see FIG. 14A).

Then, as shown in FIG. 14B, a dopant impurity of the second conductivity type is imported into the semiconductor substrate 10 masked with the gate electrodes 30a to 30c and the sidewall insulating films 42 by an ion injection method. For example, phosphorus may be used as the dopant impurity of the second conductivity type. Injection of phosphorus is performed, e.g., twice. For example, conditions for the first phosphorus injection may be include: the acceleration voltage may be about 17 keV; the dose quantity of phosphorus may be about $6 \times 10^{13}$ cm$^{-2}$. For example, conditions for the second phosphorus injection may be include: the acceleration voltage may be about 6 keV; and the dose quantity of phosphorus may be about $1.5 \times 10^{16}$ cm$^{-2}$. In this manner, impurity diffusion regions 44a to 44c may be formed as deep regions of extension source/drain structures.

The impurity diffusion regions 36a to 36c and the impurity diffusion regions 44a to 44c make up source/drain diffusion layers 46a to 46c of the extension source/drain structures, respectively.

Heat treatment is then performed to activate the dopant impurities imported into the source/drain diffusion layers 46a to 46c. For example, the temperature for heat treatment may be about 1020° C. For example, the time required for heat treatment may be about 1 second.

A high-melting metal layer, e.g., film, is then formed on the whole upper surface of the semiconductor substrate 10. For example, a cobalt film is formed as the high-melting metal film. For example, the thickness of the high-melting metal film may be about 5 nm.

Heat treatment is then performed to cause (without being bound by theory) a reaction of silicon atoms in the gate electrodes 30a to 30c with cobalt atoms in the high-melting metal film and a reaction of silicon atoms in the semiconductor substrate 10 with cobalt atoms in the high-melting metal film. For example, the temperature for heat treatment may be about 500° C. For example, the duration of the heat treatment may be about 30 minutes. Without being bound by theory, silicon atoms in the gate electrodes 30a to 30c react with cobalt atoms in the high-melting metal film to thereby form silicide films 47a of cobalt silicide. Further, without being bound by theory, silicon atoms in the semiconductor substrate 10 react with cobalt atoms in the high-melting metal film to thereby form silicide films 47b of cobalt silicide. The silicide films 47b serve as source/drain electrodes.

An unreacted part of the high-melting metal film is then removed by etching.

Heat treatment is then further performed on the silicide films 47a and 47b. For example, the temperature for heat treatment may be about 600° C. The time required for heat treatment may be about 40 seconds. After heat treatment is performed under the conditions, the peak concentrations of boron, the depths of the concentration peak of boron, the peak concentrations of indium and the depths of the concentration peak of indium, for example, include: the peak concentration of boron in each of the wells 26a to 26c may be about $9 \times 10^{17}$ cm$^{-3}$; the concentration peak of boron in each of the wells 26a to 26c may be located at a depth of about 550 nm from the upper surface of the semiconductor substrate 10; the peak concentration of indium just under the center portion of the gate electrode 30a in the pass transistor-forming region 2 may be about $1.4 \times 10^{18}$ cm$^{-3}$; the concentration peak of indium just under the center portion of the gate electrode 30a in the pass transistor-forming region 2 may be located at a depth of about 20 nm from the upper surface of the semiconductor substrate 10; the peak concentration of indium just under the edge portion of the gate electrode 30a in the pass transistor-forming region 2 may be about $1.8 \times 10^{19}$ cm$^{-3}$; the concentration peak of indium just under the edge portion of the gate electrode 30a in the pass transistor-forming region 2 may be located at a depth of about 10 nm from the upper surface of the semiconductor substrate 10; the peak concentration of indium just under the center portion of the gate electrode 30b in the high-speed transistor-forming region 4 may be about $3.2 \times 10^{18}$ cm$^{-3}$; the concentration peak of indium just under the center portion of the gate electrode 30b in the high-speed transistor-forming region 4 may be located at a depth of about 32 nm from the upper surface of the semiconductor substrate 10; the peak concentration of indium just under the edge portion of the gate electrode 30b in the high-speed transistor-forming region 4 may be about $6.5 \times 10^{18}$ cm$^{-3}$; the concentration peak of indium just under the edge portion of the gate electrode 30b in the high-speed transistor-forming region 4 may be located at a depth of about 12 nm from the upper surface of the semiconductor substrate 10; the peak concentration of indium just under the center portion of the gate electrode 30c in the ultra-high-speed transistor-forming region 6 may be about $2.2 \times 10^{18}$ cm$^{-3}$; the concentration peak of indium just under the center portion of the gate electrode 30c in the ultra-high-speed transistor-forming region 6 may be located at a depth of about 32 nm from the upper surface of the semiconductor substrate 10; the peak concentration of indium just under the edge portion of the gate electrode 30c in the ultra-high-speed transistor-forming region 6 may be about $5.0 \times 10^{18}$ cm$^{-3}$; and the concentration peak of indium just under the edge portion of the gate electrode 30c in the ultra-high-speed transistor-forming region 6 may be located at a depth of about 11 nm from the upper surface of the semiconductor substrate 10. In such a manner, a semiconductor device according to this embodiment may be produced.

The present invention is not limited to the aforementioned example embodiments and can be changed or modified variously.

Although one or more example embodiments have been described on the case where N-channel pass transistors 20, N-channel high-speed transistors 14 and N-channel ultra-high-speed transistors 16 are taken for instance, the present invention may also be applied to the case where P-channel pass transistors, P-channel high-speed transistors and P-channel ultra-high-speed transistors are formed.

Although one or more example embodiments have been described on the case where the peak concentration of the impurity of the first conductivity type just under the center portion of the gate electrode 30a of the pass transistor 20 is lower than the peak concentration of the impurity of the first conductivity type just under the center portion of the gate electrode 30c of the ultra-high-speed transistor 16 by way of example, the other embodiments of the present invention may be applied to the case where the peak concentration of the impurity of the first conductivity type just under the center portion of the gate electrode 30a of the pass transistor 20 is equal to the peak concentration of the impurity of the first conductivity type just under the center portion of the gate electrode 30c of the ultra-high-speed transistor 16. That is, one or more embodiments of the present invention become effective if the concentration of the impurity of the first conductivity type in the channel region 32a of the pass transistor 20 is set at a relatively low value.

The foregoing is considered as illustrative only of the principles of the present invention. Further, since numerous modifications and changes will readily occur to those skilled in the art, it is not desired to limit the present invention to the exact construction and applications shown and described, and accordingly, all suitable modifications and equivalents may be regarded as falling within the scope of the present invention in the appended claims and their equivalents.

What is claimed is:

1. A semiconductor device comprising:
   first transistors, second transistors, and third transistors lower in threshold voltage than at least the second transistors;
   each of the first transistors including first source/drain diffusion layers of a second conductivity type and a first doped channel layer of a first conductivity type arranged therebetween and formed in a semiconductor substrate, first source/drain diffusion layers, first pocket regions of the first conductivity type formed between the first doped channel layer and the first source/drain diffusion layers, a first gate insulating layer formed on the first doped channel layer, a first gate electrode formed on the first gate insulating layer;
   each of the second transistors including second source/drain diffusion layers of the second conductivity type and a second doped channel layer of the first conductivity type arranged therebetween and formed in the semiconductor substrate, second pocket regions of the first conductivity type formed between the second doped channel layer and the second source/drain diffusion layers, a second gate insulating layer formed on the second doped channel layer, and a second gate electrode formed on the second gate insulating layer;
   each of the third transistors including third source/drain diffusion layers of the second conductivity type and a third doped channel layer of the first conductivity type arranged therebetween and formed in the semiconductor substrate, third pocket regions of the first conductivity type formed between the third doped channel layer and the third source/drain diffusion layers, a third gate insulating formed on the third doped channel layer, and a third gate electrode formed on the third gate insulating layer;
   a peak concentration of the first conductivity type impurity under a center portion of the first gate electrode being lower than a peak concentration of the first conductivity type impurity under a center portion of the second gate electrode and not higher than a peak concentration of the first conductivity type impurity under a center portion of the third gate electrode; and
   a peak concentration of the first conductivity type impurity under an edge portion of the first gate electrode being higher than a peak concentration of the first conductivity type impurity under an edge portion of the second gate electrode and higher than a peak concentration of the first conductivity type impurity under an edge portion of the third gate electrode.

2. A semiconductor device according to claim 1, wherein a depth of the concentration peak of the first conductivity type impurity under the edge portion of the first gate electrode is smaller than a depth of the concentration peak of the first conductivity type impurity under the edge portion of the second gate electrode and smaller than a depth of the concentration peak of the first conductivity type impurity under the edge portion of the third gate electrode.

3. A semiconductor device according to claim 1, wherein a thickness of the first gate insulating layer, a thickness of the second gate insulating layer and a thickness of the third gate insulating layer are at least substantially equal.

4. A semiconductor device according to claim 1, wherein:
   the first transistors are provided in switch matrices which set routes of signals; and
   the second transistors and the third transistors are provided in logic blocks.

5. A semiconductor device comprising:
   first transistors, second transistors, and third transistors lower in threshold voltage than at least the second transistors;
   each transistor including a gate electrode, a gate insulating layer, a channel region, the channel region being formed in a semiconductor substrate;
   peak concentrations of a first conductivity type impurity under center portions of the gate electrodes of the first transistors being lower than peak concentrations of the first conductivity type impurity under center portions of the gate electrodes of the second transistors and not higher than peak concentrations of the first conductivity type impurity under center portions of the gate electrodes of the third transistors; and
   peak concentrations of the first conductivity type impurity under edge portions of the first gate electrodes being higher than peak concentrations of the first conductivity type impurity under edge portions of the second gate electrodes and higher than peak concentrations of the first conductivity type impurity under edge portions of the third gate electrodes.

6. A semiconductor device according to claim 5, wherein a depth of the concentration peak of the first conductivity type impurity under the edge portion of the first gate electrode is smaller than a depth of the concentration peak of the first conductivity type impurity under the edge portion of the second gate electrode and smaller than a depth of the concentration peak of the first conductivity type impurity under the edge portion of the third gate electrode.

7. A semiconductor device according to claim 5, wherein a thickness of the first gate insulating layer, a thickness of the second gate insulating layer and a thickness of the third gate insulating layer are at least substantially equal.

8. A semiconductor device according to claim 5, wherein:
   the first transistors are provided in switch matrices which set routes of signals; and
   the second transistors and the third transistors are provided in logic blocks.

* * * * *